United States Patent
Lock et al.

(10) Patent No.: US 12,140,377 B2
(45) Date of Patent: Nov. 12, 2024

(54) METHOD AND DEVICE FOR VIEWING AND/OR ILLUMINATING A TARGET SURFACE IN AN EVACUATED CHAMBER HAVING CONDENSABLE VAPOR THEREIN

(71) Applicant: ARCAM AB, Mölnlycke (SE)

(72) Inventors: Tomas Lock, Laholm (SE); Björn Löfving, Kärna (SE); Markus Ramsperger, Gothenburg (SE)

(73) Assignee: Arcam AB, Mölnlycke (SE)

( * ) Notice: Subject to any disclaimer, the term of this patent is extended or adjusted under 35 U.S.C. 154(b) by 673 days.

(21) Appl. No.: 17/287,760

(22) PCT Filed: Apr. 2, 2019

(86) PCT No.: PCT/EP2019/058275
§ 371 (c)(1),
(2) Date: Apr. 22, 2021

(87) PCT Pub. No.: WO2020/083531
PCT Pub. Date: Apr. 30, 2020

(65) Prior Publication Data
US 2021/0394271 A1    Dec. 23, 2021

Related U.S. Application Data

(60) Provisional application No. 62/748,726, filed on Oct. 22, 2018.

(51) Int. Cl.
| | | |
|---|---|---|
| G01N 21/15 | (2006.01) | |
| B22F 10/20 | (2021.01) | |
| B22F 10/28 | (2021.01) | |
| B22F 10/85 | (2021.01) | |
| B22F 12/00 | (2021.01) | |
| B22F 12/82 | (2021.01) | |

(Continued)

(52) U.S. Cl.
CPC .............. *F27D 21/02* (2013.01); *B22F 10/28* (2021.01); *B22F 10/85* (2021.01); *B22F 12/38* (2021.01);

(Continued)

(58) Field of Classification Search
CPC ..... G01N 21/15; G02B 27/0006; B22F 10/20; B22F 10/28
See application file for complete search history.

(56) References Cited

U.S. PATENT DOCUMENTS

| | | | |
|---|---|---|---|
| 3,170,383 A | 2/1965 | Hunt | |
| 2003/0011747 A1* | 1/2003 | Lenz | H04N 25/48 |
| | | | 348/E5.025 |

(Continued)

FOREIGN PATENT DOCUMENTS

| | | |
|---|---|---|
| EP | 3427867 A1 | 1/2019 |
| JP | H06313540 A | 11/1994 |

(Continued)

OTHER PUBLICATIONS

International Search Report and Written Opinion issued in corresponding International Application No. PCT/EP2019/058275 mailed on Sep. 25, 2020.

*Primary Examiner* — Mark A Connolly
(74) *Attorney, Agent, or Firm* — Dinsmore & Shohl LLP

(57) ABSTRACT

A device for viewing and/or illuminating a target surface in an evacuated chamber having condensable vapor therein, the device comprising: a first section with a through hole having a first end with a first opening and a second end with a second opening; and a second section having a chamber comprising a first portion with a first opening, a second portion with a second opening and a gas inlet, where the second opening is covered with a first window, said first section is attached with the first end to the first portion of the chamber allowing free passage between the chamber and the first section, said gas inlet is connectable to a gas reservoir for feeding a gas into the chamber for prohibiting the first window in the chamber for being contaminated of the condensable vapor.

18 Claims, 14 Drawing Sheets

(51) Int. Cl.
*B22F 12/90* (2021.01)
*F27D 21/02* (2006.01)
*G02B 27/00* (2006.01)
B22F 10/32 (2021.01)
B22F 12/41 (2021.01)
B22F 12/50 (2021.01)
B22F 12/55 (2021.01)
B33Y 10/00 (2015.01)
B33Y 30/00 (2015.01)
B33Y 50/00 (2015.01)

(52) U.S. Cl.
CPC .............. *B22F 12/82* (2021.01); *B22F 12/90* (2021.01); *B22F 10/32* (2021.01); *B22F 12/41* (2021.01); *B22F 12/50* (2021.01); *B22F 12/55* (2021.01); *B22F 2201/10* (2013.01); *B33Y 10/00* (2014.12); *B33Y 30/00* (2014.12); *B33Y 50/00* (2014.12)

(56) References Cited

U.S. PATENT DOCUMENTS

2009/0152771 A1  6/2009  Philippi et al.
2013/0203335 A1  8/2013  Morgenstern
2015/0367574 A1  12/2015  Araie et al.

FOREIGN PATENT DOCUMENTS

JP      3069811 B2     7/2000
WO    2017154489 A1    9/2017

* cited by examiner

METHOD AND DEVICE FOR VIEWING AND/OR ILLUMINATING A TARGET SURFACE IN AN EVACUATED CHAMBER HAVING CONDENSABLE VAPOR THEREIN

CROSS REFERENCE TO RELATED APPLICATIONS

This application is a national stage application under 35 U.S.C. § 371 of International Application No. PCT/EP2019/058275, which claims priority to and the benefit of U.S. Provisional Patent Application No. 62/748,726, filed on Oct. 22, 2018, the contents of both are hereby incorporated by reference in their respective entireties.

BACKGROUND

Related Field

The present invention relates to a device for viewing and/or illuminating a target surface in an evacuated chamber having condensable vapor therein, which target surface may be a build surface and/or a calibration surface in an additive manufacturing process and a method for forming a three dimensional article using such a device.

Description of Related Art

Freeform fabrication or additive manufacturing is a method for forming three-dimensional articles through successive fusion of chosen parts of powder layers applied to a worktable. A method and apparatus according to this technique is disclosed in US 2009/0152771.

An additive manufacturing apparatus may comprise a work table on which the three-dimensional article is to be formed, a powder dispenser, arranged to lay down a thin layer of powder on the work table for the formation of a powder bed, an energy beam for delivering energy to the powder whereby fusion of the powder takes place, elements for control of the energy given off by the energy beam over the powder bed for the formation of a cross section of the three-dimensional article through fusion of parts of the powder bed, and a controlling computer, in which information is stored concerning consecutive cross sections of the three-dimensional article. A three-dimensional article is formed through consecutive fusions of consecutively formed cross sections of powder layers, successively laid down by the powder dispenser.

The additive manufacturing process may be performed in a vacuum chamber. It may be necessary to inspect the additive manufacturing process. The inspection of the process may be performed through a window. Since the additive manufacturing process may comprise fusing of metals there are metal vapors inside the vacuum chamber which may be deposited at all surfaces inside the vacuum chamber. If the window, through which the inspection is taking place is not protected in some way, the window will receive the metal vapor and a metal deposition on the window will lose its transparency.

A known solution to this problem is to provide a movable film in front of the window inside the vacuum chamber. As the film becomes deposited with the metal it is replaced with a new non-metal deposited area of the film. A problem with the method is that the film is expensive and it requires reloading of the film after a certain usage of the machine. The film also has optical distortions that degrade the optical resolution and, in some cases, non-optimal spectral transmission.

Another known method of prohibiting metal vapor deposition onto an inspection window is to provide a shutter in front of the window, which shutter is closed during the melting process. This solution has the major drawback of not being able of inspecting the melt process without contaminating the inspection window very rapidly.

Another method of keeping the window free from metal deposition is to provide a steady flow of gas in front of the window on the inside of the vacuum chamber. A problem with the solution is that such an arrangement cannot be used in high vacuum conditions because the high gas flow will prohibit development of a high vacuum.

Another method of keeping the window free from metal deposition is to use a window heated to a high temperature such that deposited metallization evaporates. A problem with the method is that the glass needs to be very hot, about 900° C., for this method to be efficient.

A high vacuum compatible solution of keeping such inspection window of the vacuum chamber free from metal vapor deposition is disclosed in U.S. Pat. No. 3,170,383. The problem with the apparatus is that an angle of sight is small due to the relatively long tube needed for prohibit window contamination.

Therefore, there is a need in the art for an apparatus for high vacuum optical inspection and/or illumination which prohibit contamination efficiently and at the same time at least reduces or eliminates the above-mentioned problems.

SUMMARY

An object of the invention is to provide an apparatus for viewing and/or illuminating a target surface in an evacuated chamber having condensable vapor therein which at least reduces the above-mentioned problems.

The above-mentioned object is achieved by the features in the device and process recited according to the appended claim set.

In a first aspect of the invention it is provided a device for viewing and/or illuminating a target surface in an evacuated chamber having condensable vapor therein, the device comprising: a first section with a through hole having a first end with a first opening and a second end with a second opening; and a second section having a chamber comprising a first portion with a first opening, a second portion with a second opening and a gas inlet, where the second opening is covered with a window which is line of sight with the second opening of said first section, wherein the first section is attached with the first end to the second portion of the chamber allowing free passage between the chamber and the first section, wherein the gas inlet is connectable to a gas reservoir for feeding a gas into the chamber for prohibiting the window in the chamber of being contaminated of the condensable vapor, characterized in that the first opening of the first section is smaller than the second opening of the first section.

By making the first opening of the first section smaller than the second opening in the same section, the repulsion of the contamination particles may greatly be enhanced at the same time as the angle of view is greatly improved compared to existing solutions. The counter propagating gas flow has virtually the same main direction as the optical axis of the device.

In various example embodiments of the present invention the first section has a frustoconical shape.

An advantage with a first section having a frustoconical shape may be that contamination particles is repelled efficiently for prohibiting to enter and condensate on the window without severely affecting the field of view. Other designs may of course also be used where a cross section is not a perfect circle of the first section taken perpendicular to its symmetry line, for instance an elliptical shape, triangular, rectangular or any other polygonal shape. The second opening may typically have a shape that matches the desired viewing shape.

In various example embodiments of the present invention an inner wall of the frustoconical first section is building an angle $\alpha$ with respect to a symmetry line, where $5 \leq \alpha \leq 45$.

In order to suppress most contamination particles to enter and condensate on the window the angle is to be chosen with respect to the length of the first section given that a predetermined angle of view is to be achieved.

In various example embodiments of the present invention the chamber has a frustoconical shape where the second opening with the first window is larger than the first opening.

A non-limiting advantage of having a chamber with a frustoconical shape abutting with its smaller opening to a smaller opening of the first section is that the suppression of contamination particles to enter the chamber area is increased by a factor 100 or 1000 compared to having the chamber box shaped or prismatic.

In various example embodiments according to the present invention the device further comprising a third section having a through hole provided in between the first section and the chamber. The smallest opening of the first section also functions as an aperture stop for optical rays emanating from an inspection area/target area. In various alternative embodiments the third section has a frustoconical shape, where a smaller opening of the third section is abutting the smaller opening of the first section thereby forming a restriction area for flowing gas and aperture stop for optical rays.

In various alternative embodiments of the present invention an inner wall of the frustoconical second section or an inner wall of the chamber is building an angle $\beta$ with respect to a symmetry line, where $5 \leq \beta \leq 45$.

As with the first section the second section may have a frustoconical shape. In various alternative embodiments the angle $\beta$ may be equal to the angle $\alpha$. Using the same angle $\alpha$ in the first section as the angle $\beta$ in the second section/chamber may be advantageous since the suppression may be optimized for a given desired viewing angle by using the same angle in the two sections.

The third section may have the through hole with a constant area or in various alternative embodiments where the third section has a first end with a first opening coinciding with the first opening of the first section and the third section has a second end with a second opening coinciding with the first opening of the chamber. In the various example embodiments of the present inventions the pressure in the device is may be higher in the chamber where the gas inlet is provided compared to other sections thereof.

In various example embodiment of the present invention the window may be an optical lens.

The lens location facilitates a smaller first opening of the first section which may further increase the suppression of contamination particles to condensate on the lens at the same time as the angle of view may be maintained or increased compared to the situation without a lens, i.e., planar window. The lens may facilitate the use of a smaller detector compared to the non-lens situation In various example embodiments of the present invention the chamber further comprising a mirror adapted to reflect electromagnetic radiation from the target surface through the window or said first window.

A non-limiting advantage of this embodiment is that electromagnetic radiation is reflected by the mirror towards the window/lens system and other harmful radiation such as x-rays will pass thru the reflecting layer in directions other than where the window/lens is located. Additionally, possible x-rays passing a reflecting layer in the mirror may thereafter possibly creating fluorescence in the transparent material behind the reflecting layer. The fluorescence will be reflected by a backside of the reflecting layer in a direction other than the window/lens.

In various example embodiments of the present invention the device further comprising an image sensor for receiving electromagnetic radiation through the window/lens.

The image sensor may be sensitive for a specific wavelength interval either by its own functionality and/or by having one or more active or passive filters in front of the image sensor.

In various example embodiments of the present invention the device further comprising a lens system in between the image sensor and the window.

By introducing one or a plurality of lenses in between the image sensor and the front opening, the optical rays emanating from the inspection area may be further manipulated in a predetermined manner such that the optical stop of the lens system is located in front of the lens system at the first opening (C-C in FIG. 1D)

In various example embodiments the detector can be an image sensor, a CCD detector, an infrared detector, a near infra read detector, a C-MOS detector and/or a heat detector.

Using one or more of the above-mentioned image sensors may allow for inspection of a welding process or fusion process for a very long time without any decrease in performance due to the fact that the contamination of the window/lens in from of the image sensor is greatly suppressed.

In various example embodiments of the present invention the first end of the first section has an opening in the range of 1-30 mm$^2$. In various example embodiments the first end of the first section has an opening which is 3 mm$^2$. In various example embodiments the first end of the first section has an opening which is 4 mm$^2$. In various example embodiments the first end of the first section has an opening which is 5 mm$^2$.

In various example embodiments of the present invention the second end of the first section has an opening of 30-1000 mm$^2$. In various example embodiments the second end of the first section having an opening which is 30 mm$^2$. In various example embodiments the second end of the first section having an opening which is 75 mm$^2$. In various example embodiments the second end of the first section having an opening which is 150 mm$^2$. In various example embodiments the second end of the first section having an opening which is 300 mm$^2$.

In various example embodiments of the present invention the length of the first section is in the range of 75-300 mm. In various example embodiments the length of the first section is 75 mm. In various example embodiments the length of the first section is 100 mm. In various example embodiments the length of the first section is 150 mm.

In various example embodiments of the present invention the length of the second section is in the range of 10-100 mm. In various example embodiments the length of the second section is 10 mm. In various example embodiments the length of the second section is 25 mm. In various example embodiments the length of the second section is 50 mm.

In various example embodiments of the present invention said mirror in said chamber is a semitransparent mirror for reflecting at least a portion of electromagnetic radiation emanating from said target surface in said evacuated chamber onto said first electromagnetic radiation sensitive sensor and for transmitting at least a portion of the electromagnetic radiation onto a second electromagnetic radiation sensitive sensor via a second window.

An advantage of this embodiment is that the detected radiation may be detected by two different detectors. One of said detectors may be used for calibrating, verifying and/or as a reference to the other detector. Said first and second detectors may have different wavelength sensitivities for optimizing the verification and/or calibration. One of the detectors may have a different response time and/or different resolution and/or different spectral sensitivity compared to at least one of the other detectors.

In various example embodiments of the present invention it further comprising a semitransparent mirror arranged inside said chamber so as to transmit at least a portion of said electromagnetic radiation emanating from the target surface in said evacuated chamber onto said first electromagnetic radiation sensitive sensor via said mirror and said window of said chamber and so as to reflect at least a portion of said electromagnetic radiation onto a second electromagnetic radiation sensitive sensor via said window of said chamber.

An advantage of this embodiment is that two different electromagnetic radiation sensitive sensors may be used for receiving different parts (spatial and/or intensity and/or wavelength) of the electromagnetic radiation emanating from the target surface through one and the same window. Both said sensors are more or less shielded from any x-rays that may also emanate from the target surface since said mirrors do not reflect said x-rays onto said sensors.

In various example embodiments of the present invention said device further comprising a semitransparent mirror arranged outside said chamber and arranged so as to reflect at least a portion of said electromagnetic radiation emanating from the target surface in said evacuated chamber passing through said first window onto a second electromagnetic radiation sensitive device.

An advantage of this embodiment is that the semi-transparent mirror is easily provided outside said chamber meaning that the size of said chamber may be kept at a minimum. A further advantage is that the semi-transparent mirror is easily fixed outside said chamber in comparison with fixing the same inside said chamber. Yet another advantage is that said first and second electromagnetic radiation sensitive sensors are both provided shielded from x-rays that may emanate from the target surface.

In another aspect of the present invention it is provided an evacuated chamber having condensable vapor therein characterized in that the chamber is provided with a device according to any one of embodiments disclosed above. The chamber may for instance be a PVD chamber, CVD chamber, sputtering chamber, laser welding chamber, electron beam welding chamber, additive manufacturing chamber, electron beam melting (EBM) chamber, selective laser sintering chamber.

In another aspect of the present invention it is provided an additive manufacturing apparatus for forming a three-dimensional article layer by layer from powder characterized in that is has a device according to any one of the embodiments as disclosed above. The additive manufacturing may for instance use one or a plurality of electron beams and/or one or a plurality of laser beams for forming the three-dimensional article layer by layer out of the powder material. The gas introduced on the device may also be used as a process gas in the EBM process. The gas may for instance be an inert gas such as Helium, Argon or the like.

In another aspect of the present invention it is provided methods, computer-implemented methods, and/or computer program products configured to manipulate the device described elsewhere herein according to any one of the embodiments disclosed above.

In another aspect of the present invention it is provided a method for forming three-dimensional articles by successive fusing together of selected areas of a powder bed in an evacuated chamber of an additive manufacturing apparatus, which areas correspond to successive cross sections of the three-dimensional article, said method comprising,
  a. applying a powder layer to a work table in said evacuated chamber,
  b. fusing said powder layer by supplying energy from a high energy radiation source according to an operating scheme determined for the powder layer to said selected area within the powder layer such that the powder in said selected area is fused into cross sections of said three-dimensional article,
  c. providing a second chamber, said second chamber is provided with a gas inlet for providing a gas into said second chamber, a first opening covered with a window, said second chamber and said evacuated chamber having at least one common opening,
  d. viewing and/or illuminating a target surface in said evacuated chamber via said window and said common opening, and providing gas into said evacuated chamber through said common opening The advantage of using the same opening for inspection/viewing and/or illumination as providing gas into the evacuated chamber is that contamination particles may be prohibited from entering the optics (window/lens system) and thereby the service interval of said optics may be extensively prolonged. In an example embodiment said common opening is having an area less than 30 mm$^2$ and the pressure in said evacuated chamber is less than $1 \times 10^{-2}$ mBar. The common opening functions as a restriction for the gas entering the evacuated chamber, meaning that the consumption of gas may be kept at a minimum at the same time as the contamination of said optics may be reduced or eliminated. The pressure in said second chamber is higher than in said evacuated chamber. The pressure difference and said restriction (common opening) creates a flow of gas particles in an opposite direction as the contamination particles and will be an effective barrier for said contamination particles for entering the optics.

Further advantages and advantageous features of the invention are disclosed in the following description and in the claims.

BRIEF DESCRIPTION OF THE DRAWINGS

With reference to the appended drawings, below follows a more detailed description of embodiments of the invention cited as examples.

In the drawings:

FIG. 1J depicts a cross sectional side view of a tenth example embodiment of a viewing and/or illuminating device for an evacuated chamber.

DETAILED DESCRIPTION OF EXAMPLE EMBODIMENTS

Various embodiments of the present invention will now be described more fully hereinafter with reference to the accompanying drawings, in which some, but not all embodiments of the invention are shown. Indeed, embodiments of the invention may be embodied in many different forms and should not be construed as limited to the embodiments set forth herein. Rather, these embodiments are provided so that this disclosure will satisfy applicable legal requirements. Unless otherwise defined, all technical and scientific terms used herein have the same meaning as commonly known and understood by one of ordinary skill in the art to which the invention relates. The term "or" is used herein in both the alternative and conjunctive sense, unless otherwise indicated. Like numbers refer to like elements throughout.

Still further, to facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g., of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of charged particle beam can include an electron gun, a linear accelerator and so on.

Figure 1A:
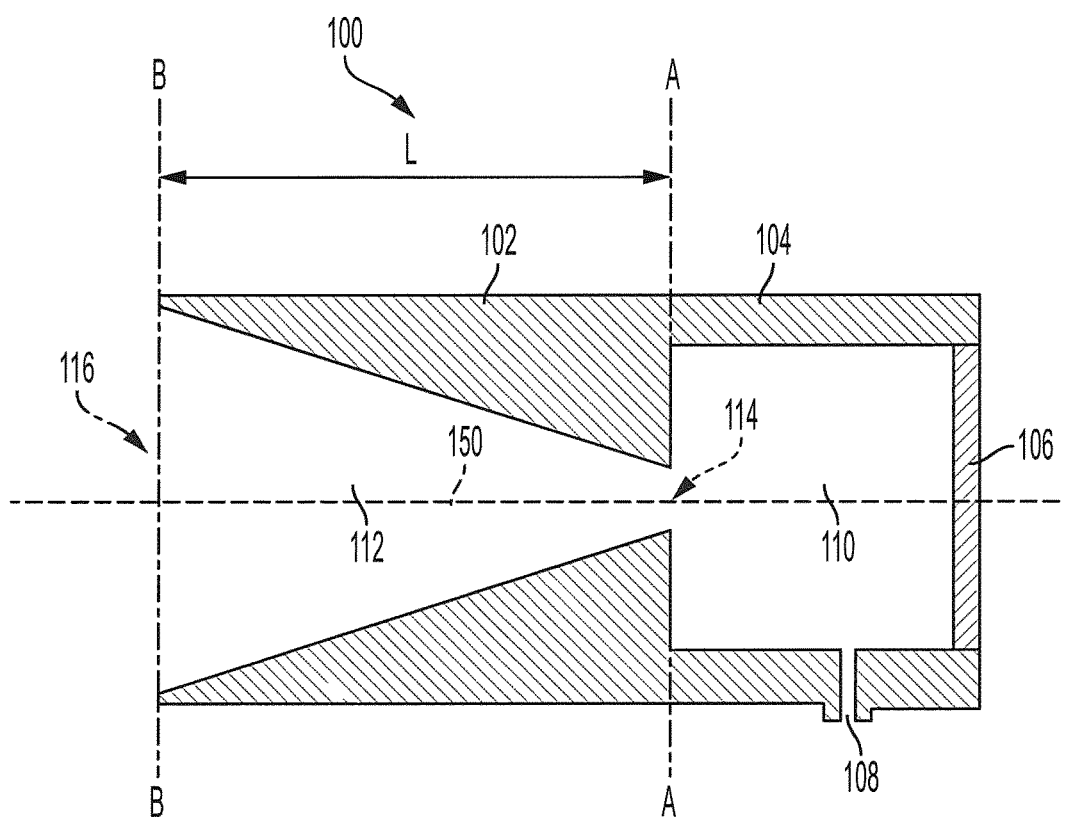
FIG. 1A depicts a cross sectional side view of a first example embodiment of a viewing and/or illuminating device for an evacuated chamber.

FIG. 1A depicts a cross sectional side view of a first example embodiment of a device 100 for viewing and/or illuminating a target surface in an evacuated chamber having condensable vapor therein of the present invention. The device 100 comprising a first portion 102 and a second portion 104. The second portion 104 is forming a chamber 110.

The chamber 110 is in this example embodiment depicted to have a square formed cross section, however other cross-sectional forms of the chamber 110 may be possible such as circular, elliptical, triangular, hexagonal or any polygonal shape.

The second portion 104 comprises a first opening into the chamber 110 covered with a first window 106, a gas inlet 108 into the chamber 110 and a second opening 114 into the chamber 110. The first opening with the first window 106 is arranged opposite to the second opening 114. The first window 106 may form a gas tight seal with walls of the chamber 110. The gas inlet 108 is provided in the second portion 104 for letting gas into the chamber 110. The gas inlet 108 is in the example embodiment arranged in the bottom of the second portion 104, however the gas inlet 108 may be provided in any place of the second portion 104 as long as the gas is allowed to flow into the chamber 110. The gas inlet 108 is connectable to a gas source (not shown). The gas inlet may be in the form of a pipe. Instead of a single gas inlet a plurality of gas inlets may be provided in the second section 104 for providing has into the chamber 110. The pipe may or may not extend into the chamber 110.

The first portion 102 is provided with a through hole 112 having a first end with a first opening 114 and a second end with a second opening 116. The first end of the first through hole 112 is arranged along the line A-A. The second end of the first through hole 112 is arranged along line B-B. The first opening 114 of the first portion 102 may be aligned with the second opening 114 of the chamber 110 thereby creating a free passage between the chamber 110 and the first through hole 112.

The first opening 114 of the first portion 102 is smaller than the second opening 116 of the first portion 102. The first portion may have a frustoconical shape. The length L may be in the range of 75-300 mm. The area of the first opening 114 may be in the range of 3-30 mm$^2$. The area of the second opening 116 may be in the range of 30-1000 mm$^2$. The volume of the chamber 110 may be above 10 mm$^3$.

By introducing the gas via the gas inlet 108 into the chamber 110 will have the effect of creating a higher pressure in the chamber 110 compared to the first portion 102. This effect will be more pronounced with a smaller opening 114. The device 100 for optical inspection is to be arranged onto an evacuated chamber having condensable vapor therein. This means that the evacuated chamber may have one or more vacuum pumps downstream of the window 106 of the device 100. Gas introduced in the chamber 110 will for this reason have a flow direction from the chamber 110 via the first portion 102 into the evacuated chamber (not shown). The relatively high pressure inside the chamber 110 and a high-speed flow direction of gas molecules in the downward direction into the evacuated chamber may prohibit or at least significantly reduce the contamination of the first window 106 of evaporation gases which may be present in the evacuated chamber.

The flow of gas into the evacuated chamber having condensable vapor therein, i.e., the flow of gas at line B-B into the evacuated chamber, may be in the range of 50-200 L/sec. The pressure in the evacuated chamber having condensable vapor therein, i.e., the pressure at line B-B, may be in the range of $1 \times 10^{-3}$ mBar or less.

The device 100 may be manufactured in a ceramic material, a polymer material or a metal material for instance stainless steel, titanium or other vacuum compatible materials.

The first and second portion 102 and 104 respectively, may be a single unit or two units attached gas tightly to each other.

Figure 1B:
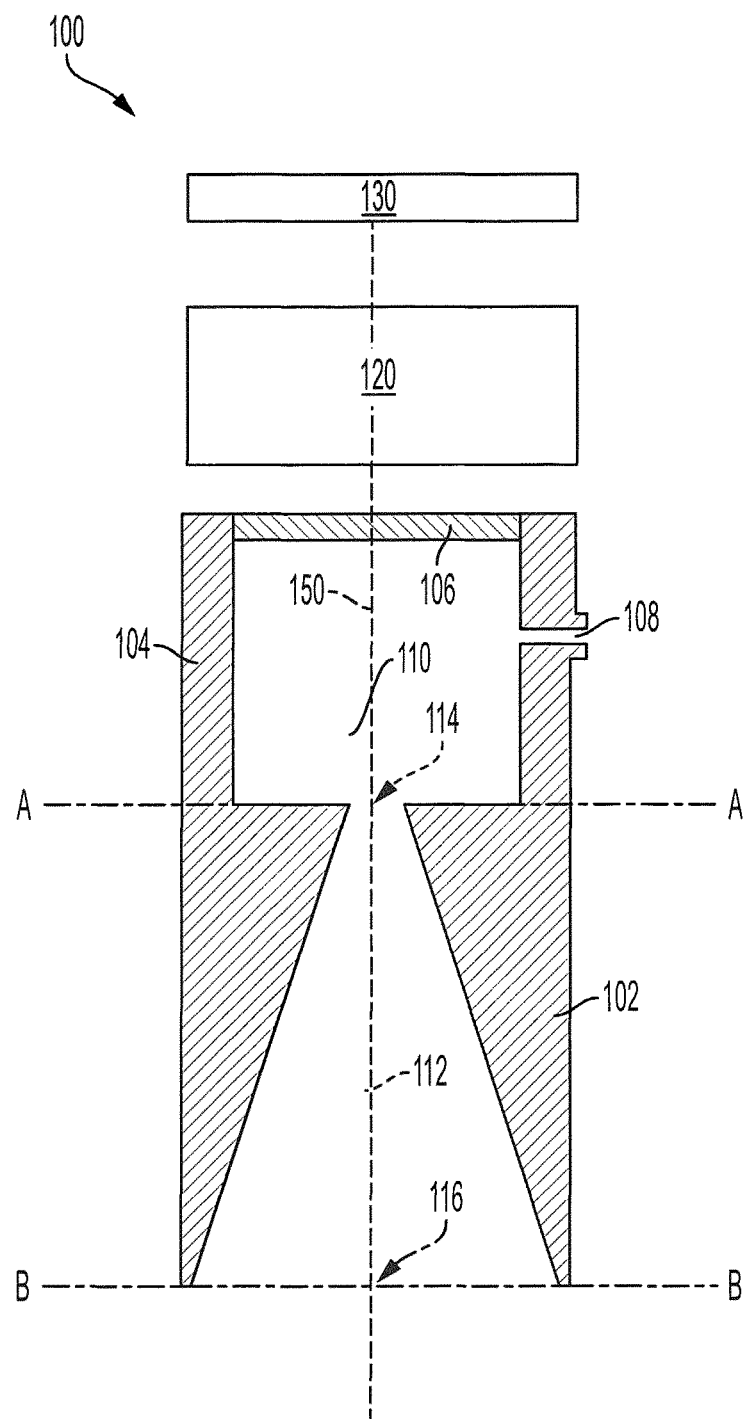
FIG. 1B depicts a cross sectional side view of a second example embodiment of a viewing and/or illuminating device for an evacuated chamber.

FIG. 1B depicts a cross sectional side view of a second example embodiment of a device for viewing the interior of an evacuated chamber having condensable vapor therein according to the present invention. This embodiment comprises in addition to the example embodiment in FIG. 1A a lens system 120 and an image sensor 130. The lens system may be adapted for creating a wide angle of view through the opening 114 which may be regarded as an aperture stop. The aperture stop or opening 114 is here provided in front of each and every lens in the lens system 120. The opening 116 defines the maximum angle of view for the device 100.

The image sensor may be a CCD-detector, an infrared detector, a near infrared detector, a C-MOS detector, a heat detector or a pyrometer.

Figure 1C:
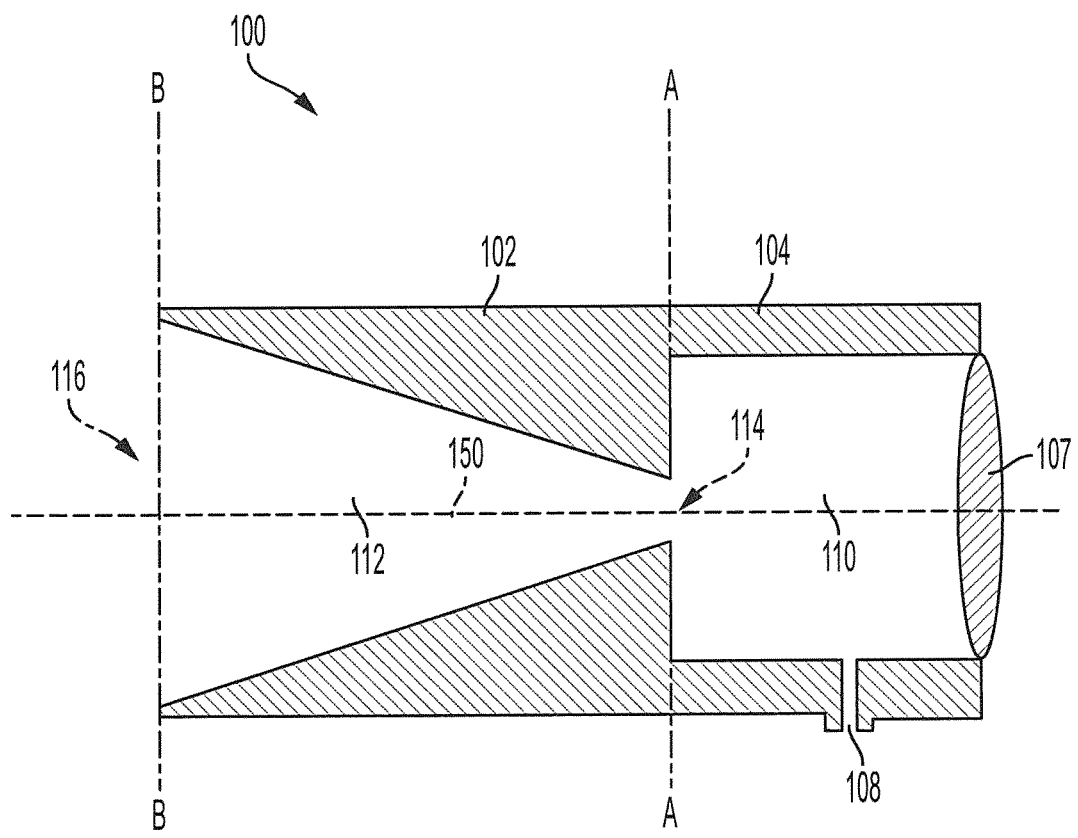
FIG. 1C depicts a cross sectional side view of a third example embodiment of a viewing and/or illuminating device for an evacuated chamber.

FIG. 1C depicts a cross-sectional side view of a third example embodiment of a device for viewing the interior of an evacuated chamber having condensable vapor therein according to present invention. FIG. 1C only differs compared to FIG. 1A in that the first window 106 in FIG. 1A is substituted with a lens 107 in FIG. 1C. The lens 107 is depicted in FIG. 1C to be a single lens. In an alternative embodiment the lens 107 may be part of a lens system comprising a plurality of lenses.

Figure 1D:
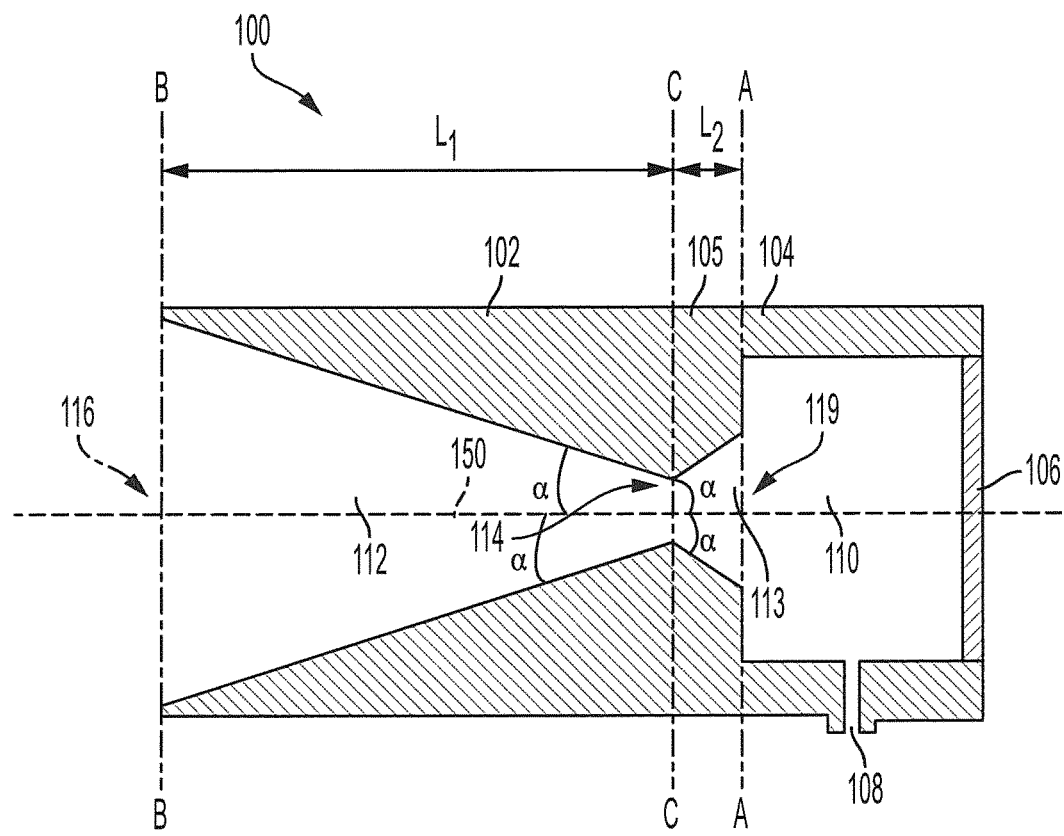
FIG. 1D depicts a cross sectional side view of a fourth example embodiment of a viewing and/or illuminating device for an evacuated chamber.

FIG. 1D depicts a cross-sectional side view of a fourth example embodiment of a device for viewing the interior of an evacuated chamber having condensable vapor therein according to present invention. The difference between this embodiment and the one depicted in FIG. 1A is a third portion 105 provided in between the first portion 102 and the second portion 104. The third portion having a second through hole 113 allowing for free passage from the chamber 110 into the first through hole 112. The third portion 105 has a first end with a first opening 114 coinciding with the first opening 114 of the first section 102. The third section 105 has a second end with a second opening 119 coinciding with the second opening of the chamber 110.

The length L2 of the second section may in various example embodiments of the present invention be in the range of 1-30 mm. The first opening 114 is smaller than the second opening 119. The through hole 113 may have a frustoconical shape. An angle α between an inner wall of the first portion 102 and a symmetry line 150 may be in the range of 15-50°. The third portion may have an angle α between its inner wall and a symmetry line 150 being equal to the angle α in the first portion. Using the same angle α in the first and third portions may be advantageous because it may increase the probability of stopping evaporation particles of reaching the first window 106 or lens 107. Using different angles between the inner walls and the symmetry line in the first section compared to the third section may reduce the likelihood of prohibiting the evaporation particles to reach the first window 106 or lens 107.

Figure 1E:
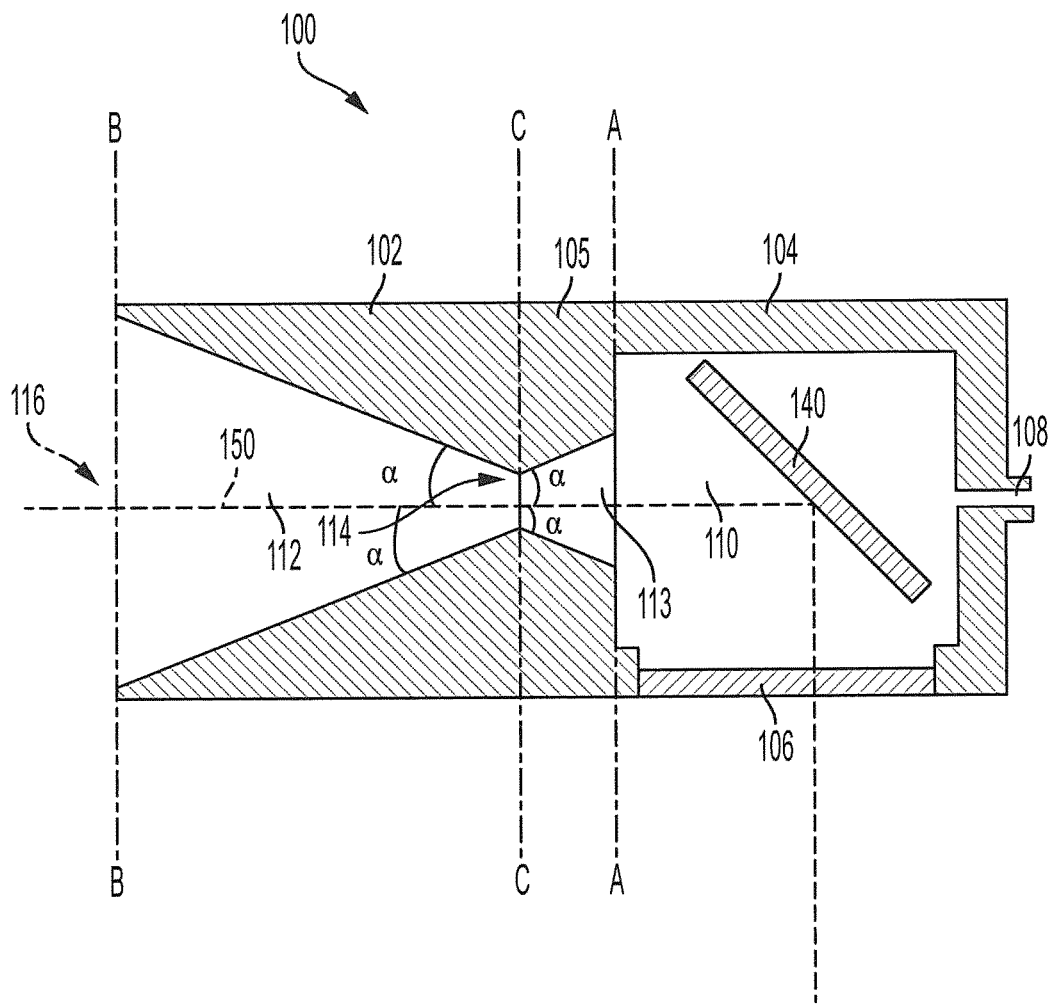
FIG. 1E depicts a cross sectional side view of a fifth example embodiment of a viewing and/or illuminating device for an evacuated chamber.

FIG. 1E depicts a cross-sectional side view of a fifth example embodiment of a device for viewing the interior of an evacuated chamber having condensable vapor therein according to present invention. The difference between this embodiment and the one depicted in FIG. 1D is a mirror 140 and a rearrangement of the window 106 and gas inlet 108. A symmetry line 150 which also could be regarded as a central optical path emanating from the evacuated chamber into the device 100 will hit the mirror 140. The mirror 140 is slanted for reflecting the electromagnetic radiation in the typical wavelength region of 400 nm-10 μm towards the window 106 now provided in the bottom of the chamber 110. In FIG. 1E an observer outside the device 100 observing through the window 106 will have a predetermined field of view of the evacuated chamber in line of sight via the mirror 140. The field of view may be 300 mm in diameter. In FIG. 1D an observer outside the device 100 observing through the window 106 will have a predetermined field of view of the evacuated chamber in line of sight. A major advantage of having the electromagnetic radiation in the typical wavelength region of 400 nm-10 μm being reflected by the mirror and transparent to x-rays is that fluorescence created inside the mirror device 140 will not be transferred to the window 106 but rather being reflected by a backside of the mirror and escape in directions other than to the window 106.

In FIG. 1E gas is provided via the nozzle 108 into the chamber 110 towards a backside of the mirror, i.e., a side which is not intended for reflecting electromagnetic radiation emanating from the evacuated chamber. In an alternative embodiment the nozzle 108 may be provided to flow gas directly onto the front side of the mirror 140. In still another example embodiment a plurality of gas nozzle may be used where some or all of them providing gas towards the front side of the mirror and/or some or all of them providing gas towards the backside of the mirror. In the example embodiments depicted in FIG. 1A-1D a plurality of gas inlets may also be used allowing for gas to flow in a common direction or in different directions.

Figure 1F:
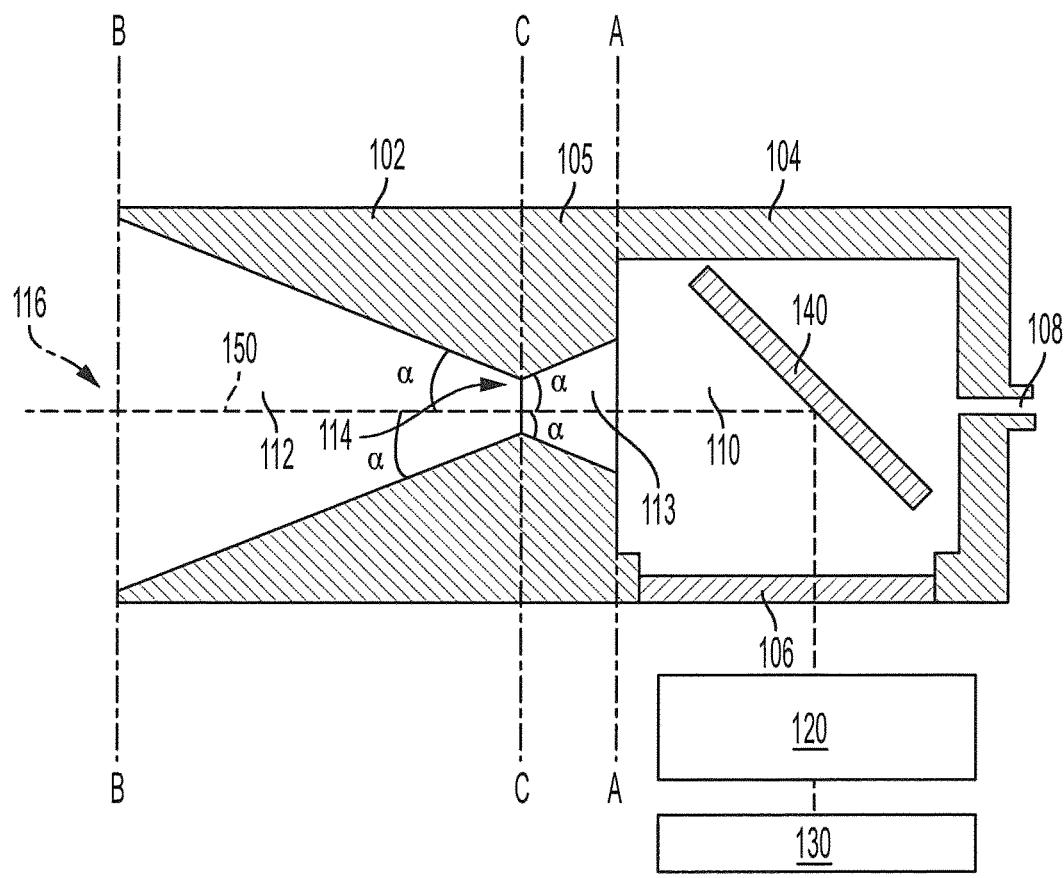
FIG. 1F depicts a cross sectional side view of a sixth example embodiment of a viewing and/or illuminating device for an evacuated chamber.

FIG. 1F depicts a cross-sectional side view of a sixth example embodiment of a device for viewing the interior of an evacuated chamber having condensable vapor therein according to present invention. The difference between this embodiment and the one depicted in FIG. 1E is an additional lens system 120 and an image sensor 130. The image sensor 130 receives electromagnetic radiation emanating from an evacuated chamber (not shown) via the mirror 140 and the lens system 120. If x-rays are present in the evacuated chamber this setup effectively reduces impingement of the x-rays onto the image sensor 130 as the x-rays passes through the mirror 140 and escape through the device 100 whereas the electromagnetic radiation of interest will be reflected by the mirror and detected by the image sensor 130. The image sensor is in X-ray shadow of any X-rays emanating from the target surface.

In the various example embodiments illustrated in FIG. 1A-1F an optical window may be left open when it is provided to an enclosure having condensable vapor therein. Such enclosure may for instance be a process chamber in an additive manufacturing apparatus such as an EBM or a laser sintering device. Such enclosure may also be a laser or electron welding process chamber, Physical vapor deposition chamber, Chemical vapor deposition chamber, sputtering chamber or the like. With the inventive device it is possible for this window to be open during for instance a melting process so that real-time optical measurements of the melt pool and the surrounding temperature can be determined. With a higher pressure in the chamber 110 compared to the rest of the evacuated chamber, the mean free path for such evaporation particles may be much less than a cm. A short mean-free path means that there is a delay for evaporated atoms from getting to a wall where they are "frozen out".

The various embodiments of the device 100 may also be used together with an electromagnetic source for illuminating the target surface through said first and/or said second window, i.e., instead of an electromagnetic radiation sensitive sensor as depicted in the various embodiments hereinabove an electromagnetic source may irradiate the target surface through said window. Said electromagnetic source may be a laser source or a white light source. In case of a laser source said laser source may have a wavelength which may be adapted to the sensitivity of an electromagnetic radiation sensitive sensor for receiving reflected laser radiation from the target surface. The laser light may be impinging on said target surface at an angle different to 90°. A plurality of illumination sources may be used with different angle of impingement on said target surface and/or different illumination directions for revealing topographic variations in said target surface.

In for instance an EBM machine the provision of non-reactive gases may be performed through the gas inlet 108 of the device 100 for viewing the interior of the EBM machine.

Figure 1G:
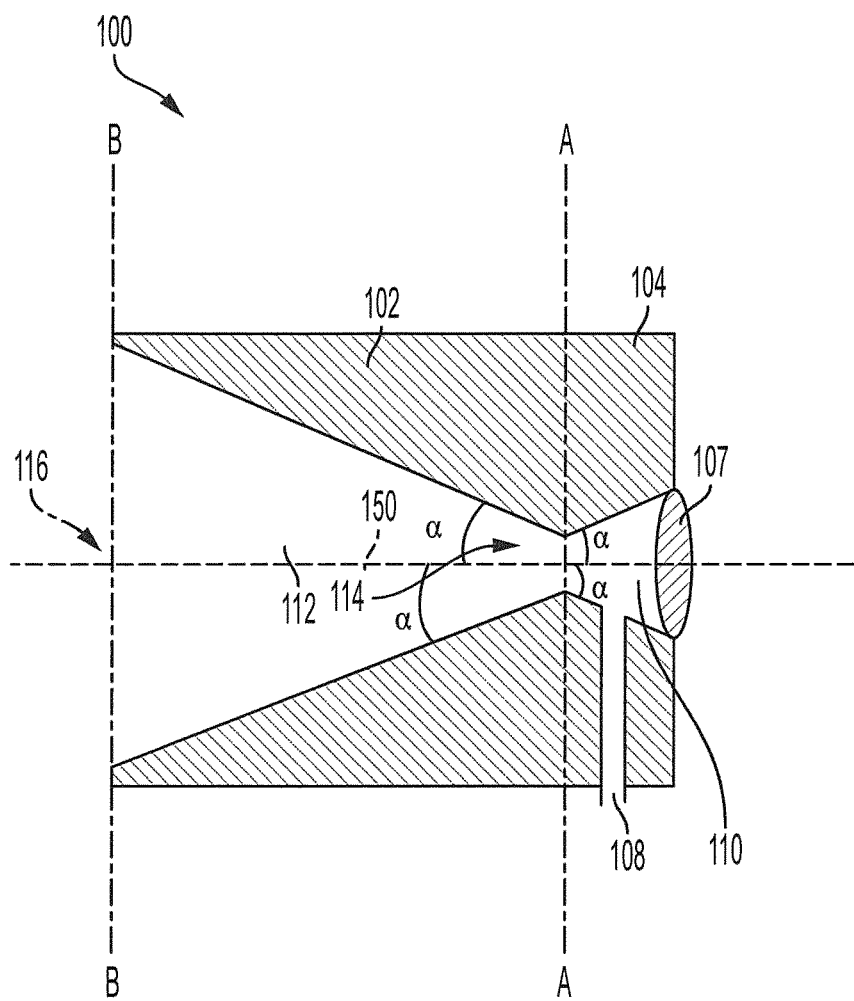
FIG. 1G depicts a cross sectional side view of a seventh example embodiment of a viewing and/or illuminating device for an evacuated chamber.

FIG. 1G depicts a cross-sectional side view of a seventh example embodiment of a device 100 for viewing the interior of an evacuated chamber having condensable vapor therein according to present invention. The difference between this embodiment and the one depicted in FIG. 1C is that the chamber 110 has a frustoconical shape. The second opening 114 of the chamber 110 has a smaller area than the first opening covered with the lens 107. In an alternative embodiment the lens is substituted with a plane window. In yet another example embodiment the lens 107 may be lens system comprising a plurality of lenses. In still another example embodiment the device 100 further comprising an image detector 130 (not shown) outside the lens 107 in line of sight with the second opening 116 of the first portion 102. The example embodiment I FIG. 1G has the advantage compared to the example embodiment in FIG. 1C in that it may suppress contamination particles to condensate on the lens 107 by several order of magnitude. This is because the second opening 114 which also functions as an aperture stop and also as a flow restrictor increases the velocity of gaseous particles introduced via the gas inlet 108. An increased velocity of gaseous particles will greatly reduce the probability for contamination particles to pass through the restriction 114. By having the lens the second opening/restriction/aperture stop 114 may further be reduced in area and thereby increasing the velocity. The reduced area in combination with higher velocity of gaseous particles flowing in the direction from the chamber 110 to into the first through hole 112 in the first section 102 will further reduce the probability of contamination particles for reaching the lens and condensate thereon. As in previous example embodiments the inner wall of the chamber 110 is building an angle α with asymmetry line 150 which may be equal to an angle α built up by the inner wall of the first section 102 with respect to the same symmetry line 150. Having the same angle α in the chamber 110 and the first section 102 is advantageous for suppressing the contamination particles compared to using different angles in the first section 102 compared to the chamber 110.

In various example embodiments said device 100 may only comprise of the second section 104 in FIG. 1G, i.e., the part to the right of line A-A. In such an embodiment the window 107 may be a lens as depicted in FIG. 1G or alternatively a planar window. The gas inlet may be a single gas inlet as depicted in FIG. 1g or alternatively a plurality of gas inlets. As in the other example embodiments the pressure is higher in the chamber 110 than in the evacuated chamber to which it is attached.

Figure 2:
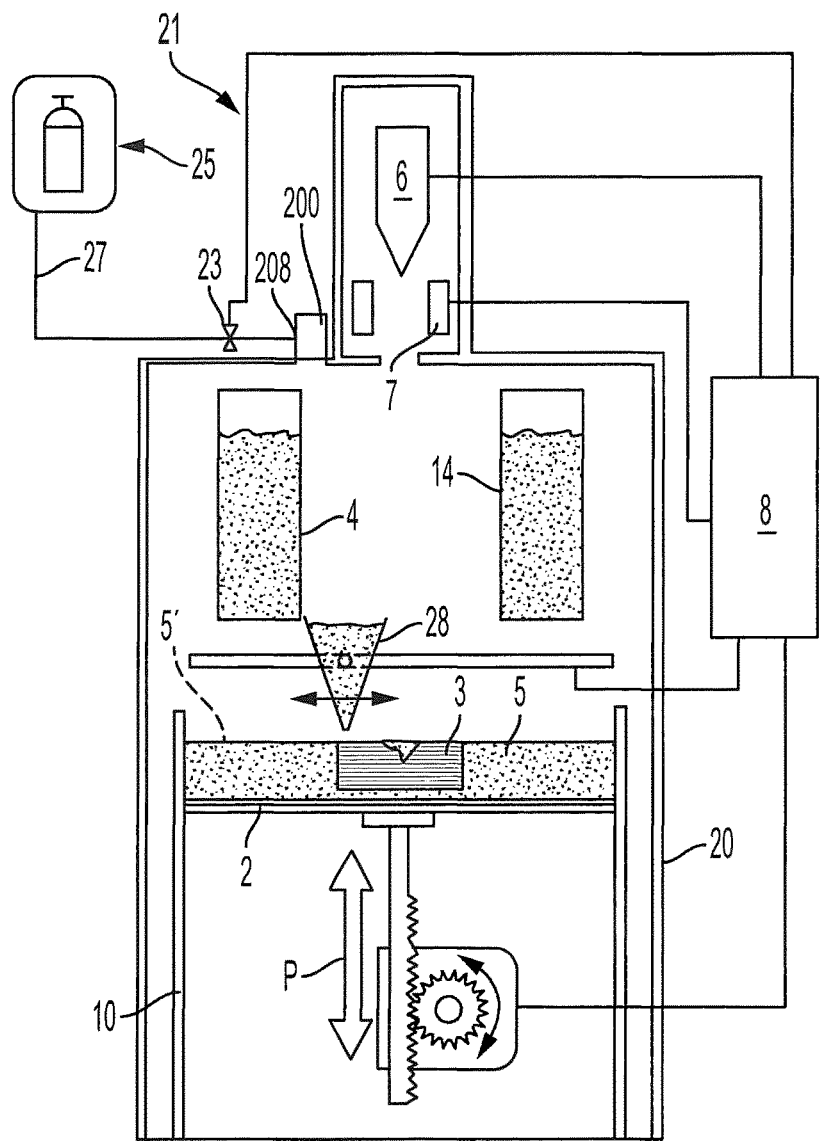
FIG. 2 depicts an example embodiment of an additive manufacturing device provided with a viewing device according to the present invention.

FIG. 2 depicts an embodiment of a freeform fabrication or additive manufacturing apparatus 21 in which the inventive device according to the present invention may be implemented.

The apparatus 21 comprising an electron beam gun 6; beam deflection coils and optionally bam shaping coils 7; two powder hoppers 4, 14; a build platform 2; build tank 10; a powder distributor 28; a powder bed 5; a vacuum chamber 20 and a device 200 for viewing the interior of the vacuum chamber 20.

The vacuum chamber or the evacuated chamber 20 is capable of maintaining a vacuum environment by means of a vacuum system, which system may comprise a turbomolecular pump, a scroll pump, an ion pump and one or more valves which are well known to a skilled person in the art and therefore need no further explanation in this context. The vacuum system is controlled by a control unit 8.

The electron beam gun 6 is generating an electron beam which is used for melting or fusing together powder material provided on the build platform 2. The control unit 8 may be used for controlling and managing the electron beam emitted from the electron beam gun 6. At least one focusing coil (not shown), at least one deflection coil 7, an optional coil for astigmatic correction (not shown) and an electron beam power supply (not shown) may be electrically connected to the control unit 8. In an example embodiment of the invention the electron beam gun 6 generates a focusable electron beam with an accelerating voltage of about 15-120 kV and with a beam power in the range of 3-20 Kw. The pressure in the vacuum chamber may be $1 \times 10^{-3}$ mbar or lower when building the three-dimensional article by fusing the powder layer by layer with the energy beam.

The powder hoppers 4, 14 comprise the powder material to be provided on the build platform 2 in the build tank 10. The powder material may, for instance, be pure metals or metal alloys such as titanium, titanium alloys, aluminum, aluminum alloys, stainless steel, Co—Cr alloys, nickel based superalloys etc.

The powder distributor 28 is arranged to lay down a thin layer of the powder material on the build platform 2. During a work cycle, the build platform 2 will be lowered successively in relation to a fixed point in the vacuum chamber. In order to make this movement possible, the build platform 2 is in one embodiment of the invention arranged movably in vertical direction, i.e., in the direction indicated by arrow P. This means that the build platform 2 starts in an initial position, in which a first powder material layer of necessary thickness has been laid down. Means for lowering the build platform 2 may for instance be through a servo engine equipped with a gear, adjusting screws etc.

An electron beam may be directed over the build platform 2 causing the first powder layer to fuse in selected locations to form a first cross section of the three-dimensional article. The beam is directed over the build platform 2 from instructions given by the control unit 8. In the control unit 8 instructions for how to control the electron beam for each layer of the three-dimensional article is stored.

After a first layer is finished, i.e., the fusion of powder material for making a first layer of the three-dimensional article, a second powder layer is provided on the build platform 2. The second powder layer is preferably distributed according to the same manner as the previous layer.

After having distributed the second powder layer on the build platform, the energy beam is directed over the work table causing the second powder layer to fuse in selected locations to form a second cross section of the three-dimensional article. Fused portions in the second layer may be bonded to fused portions of the first layer. The fused portions in the first and second layer may be melted together by melting not only the powder in the uppermost layer but also remelting at least a fraction of a thickness of a layer directly below the uppermost layer.

Instead of melting the powder material with an electron beam a laser beam may be used.

A gas reservoir 25 is connectable to the device 200 for viewing the interior of the vacuum chamber 20 via a valve 23 and a pipe 27. The valve may be operated by the control unit 8. The vacuum chamber or evacuated chamber 20 may have a pressure lower than $1\times10^{-2}$ mBar. The pressure in at least a portion of said device 200 is higher than the pressure in said evacuated chamber 20. The gas flow from said device 200 into said evacuated chamber will prohibit contamination particles in said evacuated chamber to contaminate optical components in said device 200.

In various example embodiments in the present application with example flow speeds of 100 liter/second into a chamber with pressure of 0.4 Pa, one can define a rule of thumb for the product of the radius of the first opening in said first section and the half-angle of the opening in said first section as being in the range of 0.001 to 0.0015.

The device 200 for viewing the interior of the vacuum chamber 20 may as depicted be arranged on top of the vacuum chamber 20. Alternatively, the device 200 may also be arranged at any side wall of the vacuum chamber 20. The device 200 may be any one of the herein disclosed devices 100 as depicted in FIG. 1A-1J.

It has been verified through experiments that the lifetime (no detectable contamination) of the optics (window, lenses mirror) in said chamber of the device 100 will increase by at least a factor 100 compared to prior art embodiments.

The camera may be a visible or heat sensitive camera (NIR or IR wavelength range). Examples of heat sensitive cameras may for instance be a microbolometer array, a Si image sensor or A GaAs image sensor.

The thickness of a powder layer may be in the range of 30-150 μm. The size of the metal particles in the powder material may be in the range of 45-150 μm. The powder material may also be in the range of 25-45 μm.

In various example embodiments the powder layer comprising fused and non-fused powder may be illuminated by an illumination source. The illumination source may be ordinary white light or any light within a predetermined wavelength range, for instance 400-500 nm, 500-600 nm, or 600-700 nm.

In various example embodiments the image sensor which is capturing images of the powder layer may be provided with an appropriate filter. If for instance an illumination source is irradiating a specific wavelength band onto the powder layer, the camera may be provided with a band pass filter allowing only said specific wavelength band to be detected by the camera.

In various example embodiments the camera may be provided with a long pass filter allowing only IR radiation to be detected by the camera. In an example embodiment it is provided a mechanism for switching between the band pass filter and the long pass filer. The band pass filter may be used when the powder layer is illuminated with a wavelength falling within the band of the band pass filter. A long pass filer may be used when no illumination source is used for illuminating the powder layer, i.e., pure self-radiation, i.e., heat radiation (Planck) (IR) from the powder layer.

The illumination may be performed at an angle of the surface in the evacuated chamber which is to be detected by the image sensor 130. Light impinging at angles ≠90° from a surface of be detected may be advantageous in cases where the topography is to be studied.

In an example embodiment at least one first image may be taken from powder layer N without using an illumination source and with the long pass filter in-front of the camera. At least one second image may be taken from powder layer N when using an illumination source and with the band pass filter in-front of the camera. The illumination source has a wavelength within the wavelength range of the band pass filter. The first and second images may be correlated in order to enhance the information from a specific powder layer. By the inventive device for viewing the target surface in an evacuated chamber the heat distribution of a melt pool may be determined without severely contaminating the inspection window.

The image taken by the camera may be treated in an imaging program. Pixels in the image may for instance have local threshold levels depending on the pixels specific position and its surrounding.

A plurality of images may be taken from one and the same powder layer and be used in an imaging program for removing noise.

In an alternative embodiment of the present invention a light source may be attached outside the window 106 and/or lens 107. The light source may be used to light up the inspection area of interest. In various example embodiments a plurality of such devices 100 with light source may be attached to an evacuated chamber having condensable vapor therein. The devices may light up the inspection area with rays having different angle of impingement, i.e., the devices are located at different positions/heights on the chamber so that a topography may be detected.

Figure 1H:
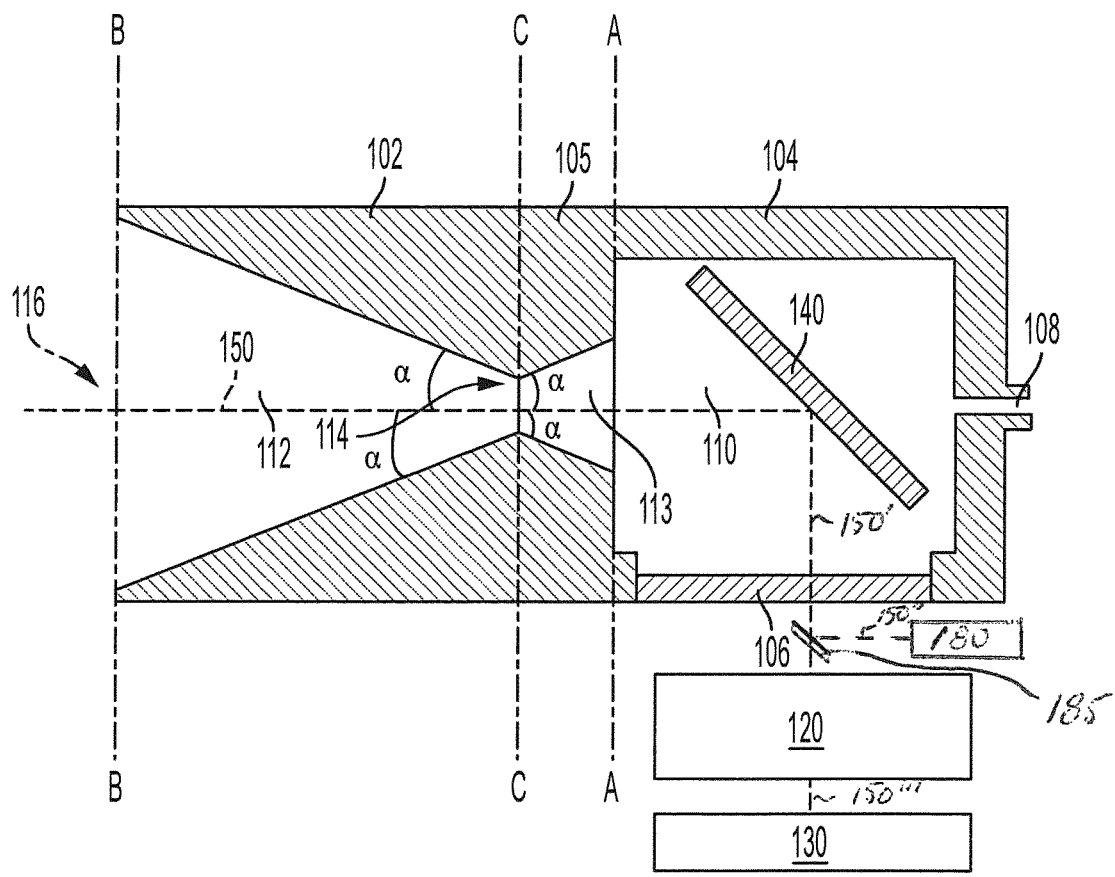
FIG. 1H depicts a cross sectional side view of an eighth example embodiment of a viewing and/or illuminating device for an evacuated chamber.

In an eighth example embodiment, depicted in FIG. 1H, which only differs to the one depicted in FIG. IF in that FIG. IH is provided with a second electromagnetic radiation sensitive sensor 180 and a semi-transparent mirror 185. The semi-transparent mirror 185 is in FIG. 1H arranged between the first window 106 and the lens system 120. At least a first portion 150''' of the electromagnetic radiation coming through said window 106 is passing through said semi-transparent mirror 185 onto said first electromagnetic radiation sensitive sensor 130 via said lens system 120. At least a second portion 150'' of said electromagnetic radiation coming through said window 106 is reflected by said semi-transparent mirror 185 onto said second electromagnetic radiation sensitive sensor 180. One or more optical lenses may be provided in front of said second electromagnetic radiation sensitive sensor 180 as in the case of the lens system 120 in front of the first electromagnetic radiation sensitive sensor 130.

The semi-transparent mirror 185 may be a dichroic mirror that partly reflects a specific first wavelength band that is design for said second electromagnetic radiations sensitive sensor 180. Said first wavelength band may differ from the sensitivity of the first electromagnetic radiation sensitive sensor 130. Said first and second wavelength bands may be fully separated by each other or partially overlapping. The semi-transparent mirror 185 may be arranged anywhere outside the chamber 110 on the optical axis 150' of the lens system 120, i.e., it may be arranged between the window 106 and the lens system as depicted in FIG. 1H, it may be arranged in between any of the lenses in said lens system 120 or it may be arranged in between the lens system 120 and said electromagnetic radiation sensitive sensor 130.

The semi-transparent mirror 185 may have a much smaller area than the lens system 120 and/or the sensor area of the first electromagnetic radiation sensitive sensor 130, i.e., the disturbance of said semi-transparent mirror 185 to the original rays of electromagnetic radiation can more or less be neglected.

In various example embodiments the second electromagnetic radiation sensitive sensor 180 may be used as a verification, reference or calibration unit for said first electromagnetic radiation sensitive sensor 130.

The first wavelength band of said first electromagnetic radiation sensitive sensor 130 may constitute of wavelengths shorter than 1 μm. The second wavelength band of said second electromagnetic radiation sensitive sensor 180 may constitute of wavelengths longer than 1 μm.

The second electromagnetic radiation sensitive sensor 180 may be a CCD-camera, an infrared camera, a near infrared camera, a C-MOS camera, a heat camera or a pyrometer. The pyrometer may have a single sensor or multiple sensors. In case of multiple sensors said sensors may measure different wavelengths. In a so-called ratio mode (2-color mode or 2 wavelength mode) the pyrometer is measuring simultaneously with 2 sensors in adjacent wavelengths bands. It calculates the temperature by ratioing the radiation intensities of the two wavelengths. The ratio technique may eliminate a number of factors that may degrade the accuracy of a conventional single color or single wavelength band instrument e.g. measurement independent of emissivity in wide areas, unaffected by dust in the field of view, unaffected by dirty viewing window or lenses, etc. In some cases, the emissivities of the two wavelengths can differ so that it is necessary to correct the ratio of the two emissivities to get a correct temperature reading. Objects which could be may be smaller than the spot size of said pyrometer. Measurements with a 2-color pyrometer are mostly independent of the emissivity of the object to be measured.

In an example embodiment said pyrometer may have a first wavelength band centered around 1.28 μm and a second wavelength band centered around 1.65 μm. Said first and second wavelength bands may be fully separated or partially overlapping each other.

The pyrometer may be used for calibrating the first electromagnetic radiation sensitive sensor 130, i.e., if said first electromagnetic radiation sensitive sensor 130 is a heat camera said pyrometer may be used for calibrating the heat camera temperature images. Said pyrometer may also be used as a reference for said first electromagnetic radiation sensitive sensor 130. Said pyrometer may also be used as a verification of the temperature results from said first electromagnetic radiation sensitive sensor 130. Said pyrometer may be used as a real time process control with a fast feedback loop system.

The semi-transparent mirror 185 and said second electromagnetic radiation sensitive sensor 180 may also be added to other example embodiments than the above exemplified embodiment in FIG. 1H. For instance, the semi-transparent mirror may be arranged in between said window 106 and said lens system 120, or in between lenses in said lens system 120 or in between said lens system and said first electromagnetic radiation sensitive sensor 130 as shown in FIG. 1b. The second electromagnetic radiation sensitive sensor 180 is then arranged for receiving at least a portion of the reflected electromagnetic radiation from said semi-transparent mirror 185. The semi-transparent mirror 185 and said second electromagnetic sensitive sensor 180 may be used together with any device 100 for viewing a target surface in an evacuated chamber having condensable vapor therein according to the present invention.

Figure 1I:
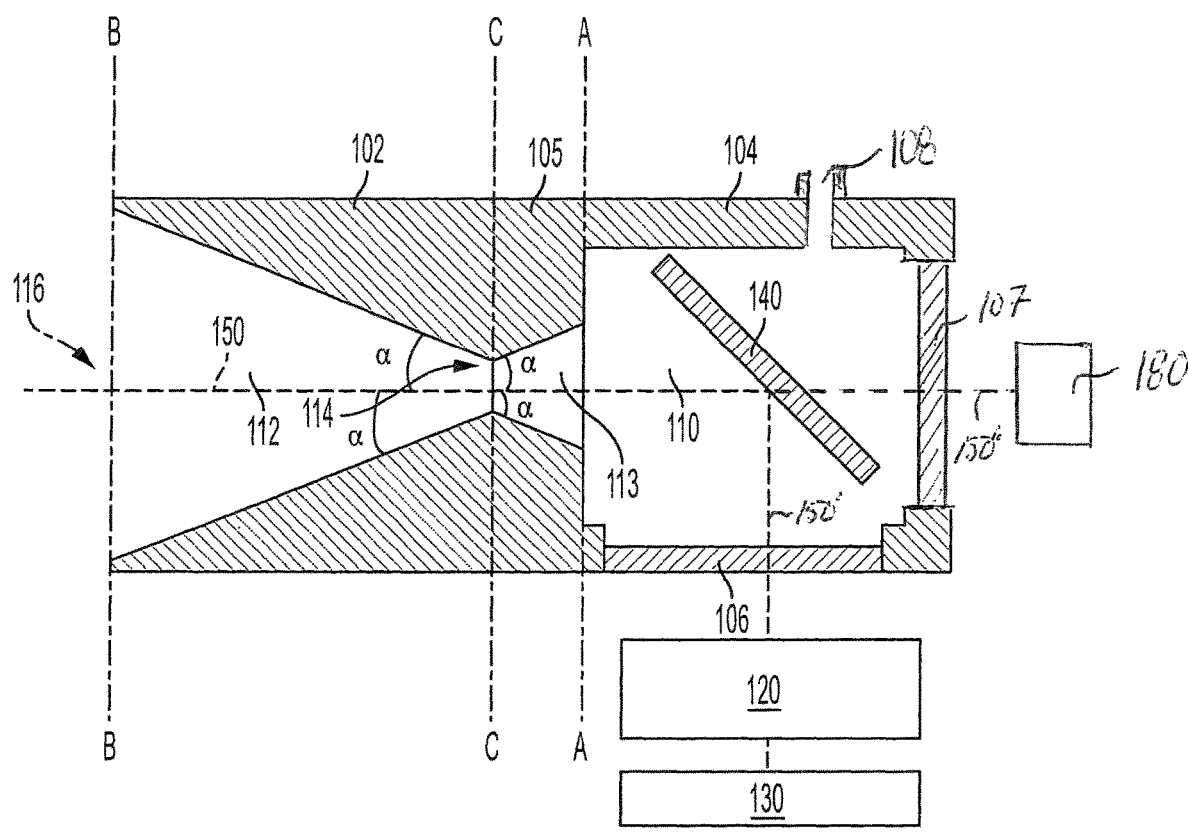
FIG. 1I depicts a cross sectional side view of a ninth example embodiment of a viewing and/or illuminating device for an evacuated chamber.
Figure 13:
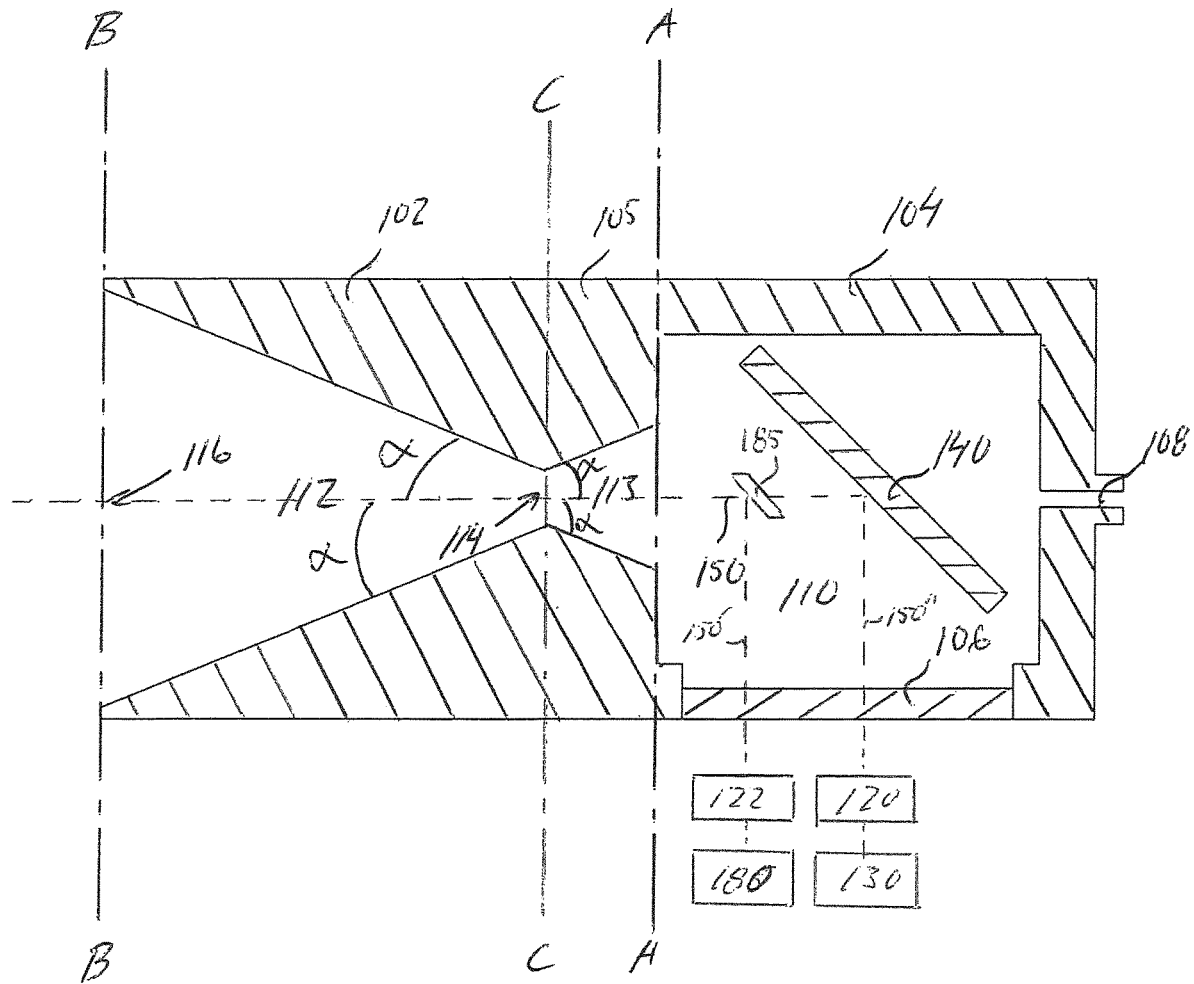

In a ninth example embodiment, depicted in FIG. 1I, which only differs to the one depicted in FIG. 1F in that a second electromagnetic radiation sensitive sensor 180 and a second window 107 is added and that the mirror 140 is a semi-transparent mirror.

The semi-transparent mirror 140 is in FIG. 1I arranged in said chamber 110 for reflecting a first portion of electromagnetic radiation 150' onto a first electromagnetic radiation sensitive sensor 130 via said first window 106 and said lens system 120.

At least a second portion 150" of said electromagnetic radiation is transmitted through said semi-transparent mirror 140 onto said second electromagnetic radiation sensitive sensor 180 via said second window 107. One or more optical lenses may be provided in front of said second electromagnetic radiation sensitive sensor 180 as in the case of the lens system 120 in front of the first electromagnetic radiation sensitive sensor 130.

As in the previous embodiments, said second electromagnetic radiation sensitive source 180 may be used for calibrating, verifying or as a reference for said first electromagnetic radiation sensitive sensor 130.

The gas inlet 108 may be arranged anywhere onto said chamber 110 for providing gas into said chamber for reducing or eliminating condensable vapor onto said first and second windows and said mirror/semi-transparent mirror 140. In the figures only one gas inlet is depicted, obviously two or more gas inlets may also be used.

In an alternative embodiment as depicted in FIG. 1J one can arrange a first semi-transparent mirror 185 in-front of a non-transparent mirror 140 on the same optical axis 150 inside said chamber 110. A first portion of electromagnetic radiation 150' will be reflected by said semi-transparent mirror 185 onto a first portion of the first window 106, a second portion of said electromagnetic radiation 150" will be reflected by said non-transparent mirror 140 onto a second portion of said first window. Said first electromagnetic radiation sensitive sensor 130 is arranged for receiving said second portion of electromagnetic radiation 150" via a first lens system 120. Said second electromagnetic radiation sensitive sensor 180 is arranged for receiving said electromagnetic first portion of electromagnetic radiation 150' via a second lens system 122. The semi-transparent mirror 185 may have an area which may be much smaller than said non-transparent mirror 140. In the example embodiment in FIG. 1J said first and second electromagnetic radiation sensitive sensors both receive said electromagnetic radiation from said chamber 100 through said single window 106. The advantage of having the sensors at an angle from the original optical axis 150 is that possible x-ray emanating from the area to be inspected may not disturb the electromagnetic radiation sensitive sensors 130, 180.

In an alternative embodiment yet another semi-transparent mirror may be arranged on the optical axis 150 in said chamber allowing for dividing said beam into yet another separate beam of electromagnetic radiation to be detected by another electromagnetic radiation sensitive sensor. Said sensor may have a wavelength sensitivity which is different to the other two sensors, i.e., three different sensors with three different wavelength sensitivities.

In a method according to various example embodiments of the present invention for forming three-dimensional articles by successive fusing together of selected areas of a powder bed in an evacuated chamber of an additive manufacturing apparatus, which areas correspond to successive cross sections of the three-dimensional article, said method comprising,
   a. applying a powder layer to a work table in said evacuated chamber,
   b. fusing said powder layer by supplying energy from a high energy radiation source according to an operating scheme determined for the powder layer to said selected area within the powder layer such that the powder in said selected area is fused into cross sections of said three-dimensional article,
   c. providing a second chamber, said second chamber is provided with a gas inlet for providing a gas into said second chamber, a first opening covered with a window, said second chamber and said evacuated chamber having at least one common opening,
   d. viewing and/or illuminating a target surface in said evacuated chamber via said window and said common opening, and
   e. providing gas into said evacuated chamber through said common opening.

In the inventive method the illumination and/or inspection/viewing of a target surface is performed through a common opening of said evacuated chamber and said second chamber. Through said common opening said gas is also introduced into said evacuated chamber. The gas may be any inert gas, for instance Helium or Argon. Said second chamber may be any one of the devices 100 as depicted in FIGS. 1A-1J.

In another example embodiment the device for viewing and/or illuminating a target surface in an evacuated chamber having condensable vapor therein comprising:
a chamber comprising a first portion with a first opening, a second portion with a second opening and a gas inlet, where the second opening is covered with a first window, said first window is in line of sight with the first opening and said gas inlet is connectable to a gas reservoir for feeding a gas into the chamber for prohibiting the first window in the chamber for being contaminated of the condensable vapor. Said first opening is in common with an opening of said evacuated chamber.

The chamber is having a pressure which is higher than said evacuated chamber. Said common opening may be less than 100 mm$^2$ in area, in another example embodiment said common opening has an area less than 50 mm$^2$ and in yet another example embodiment said common opening has an area less than 30 mm$^2$. The pressure in said evacuated chamber may be less than $1\times10^{-2}$ mBar. The target surface may be a powder surface in an additive manufacturing apparatus or a calibration surface in an additive manufacturing apparatus. The evacuated chamber may have a pump capacity in the range of between 50-200 l/sec at $1\times10^{-6}$ mBar. It has been experimentally verified that the lifetime of the optics (window, lenses) in said chamber with a common opening less than 75 mm$^2$ and a gas flow of 50 l/sec at $1\times10^{-6}$ mBar is several years.

The control unit can be combined with any of the features disclosed hereinabove. And as mentioned, various embodiments of the present invention may be implemented in various ways, including as computer program products and/or via utilization of the control unit. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (Fe-RAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like, as have been described elsewhere herein. As such, embodiments of the present invention may take the form of an apparatus, system, computing device, computing entity, and/or the like executing instructions stored on a computer-readable storage medium to perform certain steps or operations. However, embodiments of the present invention may also take the form of an entirely hardware embodiment performing certain steps or operations.

Various embodiments are described below with reference to block diagrams and flowchart illustrations of apparatuses, methods, systems, and computer program products. It should be understood that each block of any of the block diagrams and flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks.

Accordingly, blocks of the block diagrams and flowchart illustrations support various combinations for performing the specified functions, combinations of operations for performing the specified functions and program instructions for performing the specified functions. It should also be understood that each block of the block diagrams and flowchart illustrations, and combinations of blocks in the block diagrams and flowchart illustrations, could be implemented by special purpose hardware-based computer systems that perform the specified functions or operations, or combinations of special purpose hardware and computer instructions.

Figure 3:
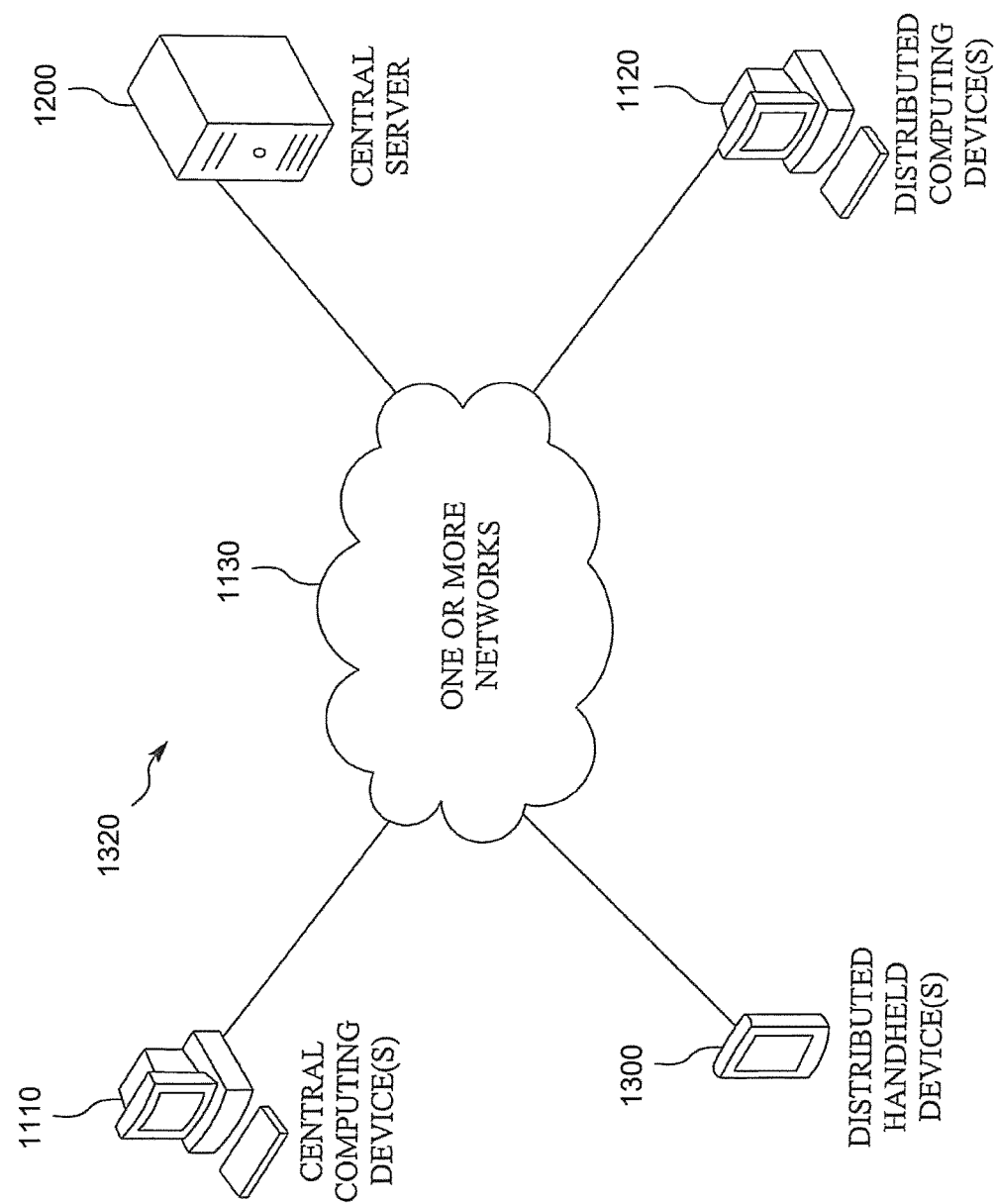
FIG. 3 is a block diagram of an exemplary system according to various embodiments.

FIG. 3 is a block diagram of an exemplary system 1320 that can be used in conjunction with various embodiments of the present invention. In at least the illustrated embodiment, the system 1320 may include one or more central computing devices 1110, one or more distributed computing devices 1120, and one or more distributed handheld or mobile devices 1300, all configured in communication with a central server 1200 (or control unit) via one or more networks 1130. While FIG. 3 illustrates the various system entities as separate, standalone entities, the various embodiments are not limited to this particular architecture.

According to various embodiments of the present invention, the one or more networks 1130 may be capable of supporting communication in accordance with any one or more of a number of second-generation (2G), 2.5G, third-generation (3G), and/or fourth-generation (4G) mobile communication protocols, or the like. More particularly, the one or more networks 130 may be capable of supporting communication in accordance with 2G wireless communication protocols IS-136 (TDMA), GSM, and IS-95 (CDMA). Also, for example, the one or more networks 1130 may be capable of supporting communication in accordance with 2.5G wireless communication protocols GPRS, Enhanced Data GSM Environment (EDGE), or the like. In addition, for example, the one or more networks 130 may be capable of supporting communication in accordance with 3G wireless communication protocols such as Universal Mobile Telephone System (UMTS) network employing Wideband Code Division Multiple Access (WCDMA) radio access technology. Some narrow-band AMPS (NAMPS), as well as TACS, network(s) may also benefit from embodiments of the present invention, as should dual or higher mode mobile stations (e.g., digital/analog or TDMA/CDMA/analog phones). As yet another example, each of the components of the system 1320 may be configured to communicate with one another in accordance with techniques such as, for example, radio frequency (RF), Bluetooth™, infrared (IrDA), or any of a number of different wired or wireless networking techniques, including a wired or wireless Personal Area Network ("PAN"), Local Area Network ("LAN"), Metropolitan Area Network ("MAN"), Wide Area Network ("WAN"), or the like.

Although the device(s) 1110-3100 are illustrated in FIG. 3 as communicating with one another over the same network 1130, these devices may likewise communicate over multiple, separate networks.

According to one embodiment, in addition to receiving data from the server 1200, the distributed devices 1110, 1120, and/or 1300 may be further configured to collect and transmit data on their own. In various embodiments, the devices 1110, 1120, and/or 1300 may be capable of receiving data via one or more input units or devices, such as a keypad, touchpad, barcode scanner, radio frequency identification (RFID) reader, interface card (e.g., modem, etc.) or receiver. The devices 1110, 1120, and/or 1300 may further be capable of storing data to one or more volatile or non-volatile memory modules, and outputting the data via one or more output units or devices, for example, by displaying data to the user operating the device, or by transmitting data, for example over the one or more networks 1130.

In various embodiments, the server 1200 includes various systems for performing one or more functions in accordance with various embodiments of the present invention, including those more particularly shown and described herein. It should be understood, however, that the server 1200 might include a variety of alternative devices for performing one or more like functions, without departing from the spirit and scope of the present invention. For example, at least a portion of the server 1200, in certain embodiments, may be located on the distributed device(s) 1110, 1120, and/or the handheld or mobile device(s) 1300, as may be desirable for particular applications. As will be described in further detail below, in at least one embodiment, the handheld or mobile device(s) 1300 may contain one or more mobile applications 1330 which may be configured so as to provide a user interface for communication with the server 1200, all as will be likewise described in further detail below.

Figure 4:
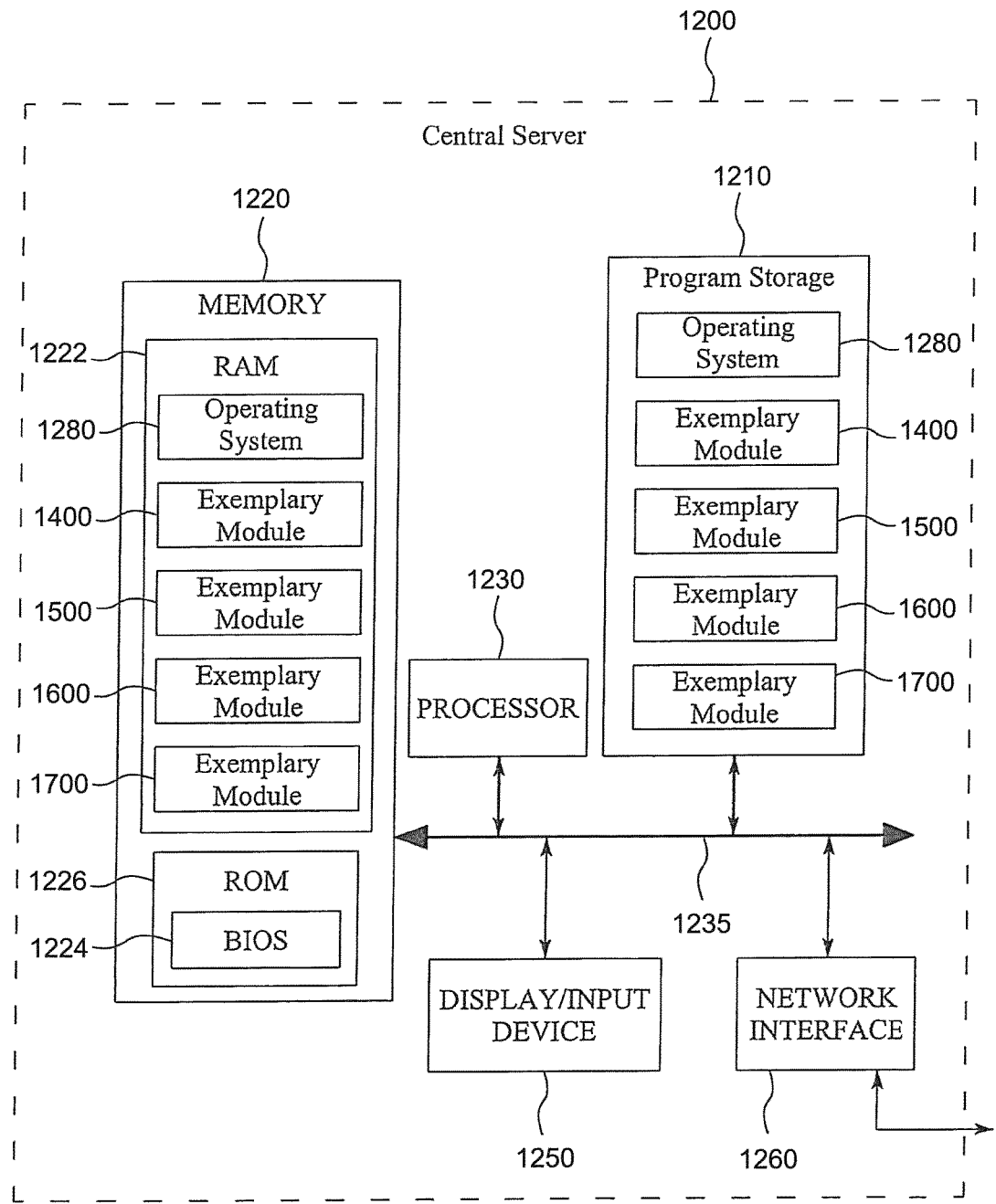
FIG. 4 is a schematic block diagram of an exemplary server according to various embodiments.

FIG. 4 is a schematic diagram of the server 1200 according to various embodiments. The server 1200 includes a processor 1230 that communicates with other elements within the server via a system interface or bus 1235. Also included in the server 1200 is a display/input device 1250 for receiving and displaying data. This display/input device 1250 may be, for example, a keyboard or pointing device that is used in combination with a monitor. The server 1200 further includes memory 1220, which typically includes both read only memory (ROM) 1226 and random access memory (RAM) 1222. The server's ROM 1226 is used to store a basic input/output system 1224 (BIOS), containing the basic routines that help to transfer information between elements within the server 1200. Various ROM and RAM configurations have been previously described herein.

In addition, the server 1200 includes at least one storage device or program storage 1210, such as a hard disk drive, a floppy disk drive, a CD Rom drive, or optical disk drive, for storing information on various computer-readable media, such as a hard disk, a removable magnetic disk, or a CD-ROM disk. As will be appreciated by one of ordinary skill in the art, each of these storage devices 1210 are connected to the system bus 1235 by an appropriate interface. The storage devices 1210 and their associated computer-readable media provide nonvolatile storage for a personal computer. As will be appreciated by one of ordinary skill in the art, the computer-readable media described above could be replaced by any other type of computer-readable media known in the art. Such media include, for example, magnetic cassettes, flash memory cards, digital video disks, and Bernoulli cartridges.

Although not shown, according to an embodiment, the storage device 1210 and/or memory of the server 1200 may further provide the functions of a data storage device, which may store historical and/or current delivery data and delivery conditions that may be accessed by the server 1200. In this regard, the storage device 1210 may comprise one or more databases. The term "database" refers to a structured collection of records or data that is stored in a computer system, such as via a relational database, hierarchical database, or network database and as such, should not be construed in a limiting fashion.

A number of program modules (e.g., exemplary modules 1400-1700) comprising, for example, one or more computer-readable program code portions executable by the processor 1230, may be stored by the various storage devices 1210 and within RAM 1222. Such program modules may also include an operating system 1280. In these and other embodiments, the various modules 1400, 1500, 1600, 1700 control certain aspects of the operation of the server 1200 with the assistance of the processor 1230 and operating system 1280. In still other embodiments, it should be understood that one or more additional and/or alternative modules may also be provided, without departing from the scope and nature of the present invention.

In various embodiments, the program modules 1400, 1500, 1600, 1700 are executed by the server 1200 and are configured to generate one or more graphical user interfaces, reports, instructions, and/or notifications/alerts, all accessible and/or transmittable to various users of the system 1320. In certain embodiments, the user interfaces, reports, instructions, and/or notifications/alerts may be accessible via one or more networks 1130, which may include the Internet or other feasible communications network, as previously discussed.

In various embodiments, it should also be understood that one or more of the modules 1400, 1500, 1600, 1700 may be alternatively and/or additionally (e.g., in duplicate) stored locally on one or more of the devices 1110, 1120, and/or 1300 and may be executed by one or more processors of the same. According to various embodiments, the modules 1400, 1500, 1600, 1700 may send data to, receive data from, and utilize data contained in one or more databases, which may be comprised of one or more separate, linked and/or networked databases.

Also located within the server 1200 is a network interface 1260 for interfacing and communicating with other elements of the one or more networks 1130. It will be appreciated by one of ordinary skill in the art that one or more of the server 1200 components may be located geographically remotely from other server components. Furthermore, one or more of the server 1200 components may be combined, and/or additional components performing functions described herein may also be included in the server.

While the foregoing describes a single processor 1230, as one of ordinary skill in the art will recognize, the server 1200 may comprise multiple processors operating in conjunction with one another to perform the functionality described herein. In addition to the memory 1220, the processor 1230 can also be connected to at least one interface or other means for displaying, transmitting and/or receiving data, content or the like. In this regard, the interface(s) can include at least one communication interface or other means for transmitting and/or receiving data, content or the like, as well as at least one user interface that can include a display and/or a user input interface, as will be described in further detail below. The user input interface, in turn, can comprise any of a number of devices allowing the entity to receive data from a user, such as a keypad, a touch display, a joystick or other input device.

Still further, while reference is made to the "server" 1200, as one of ordinary skill in the art will recognize, embodiments of the present invention are not limited to traditionally defined server architectures. Still further, the system of embodiments of the present invention is not limited to a single server, or similar network entity or mainframe computer system. Other similar architectures including one or more network entities operating in conjunction with one another to provide the functionality described herein may likewise be used without departing from the spirit and scope of embodiments of the present invention. For example, a mesh network of two or more personal computers (PCs), similar electronic devices, or handheld portable devices, collaborating with one another to provide the functionality described herein in association with the server 200 may likewise be used without departing from the spirit and scope of embodiments of the present invention.

According to various embodiments, many individual steps of a process may or may not be carried out utilizing the computer systems and/or servers described herein, and the degree of computer implementation may vary, as may be desirable and/or beneficial for one or more particular applications.

Figure 5:
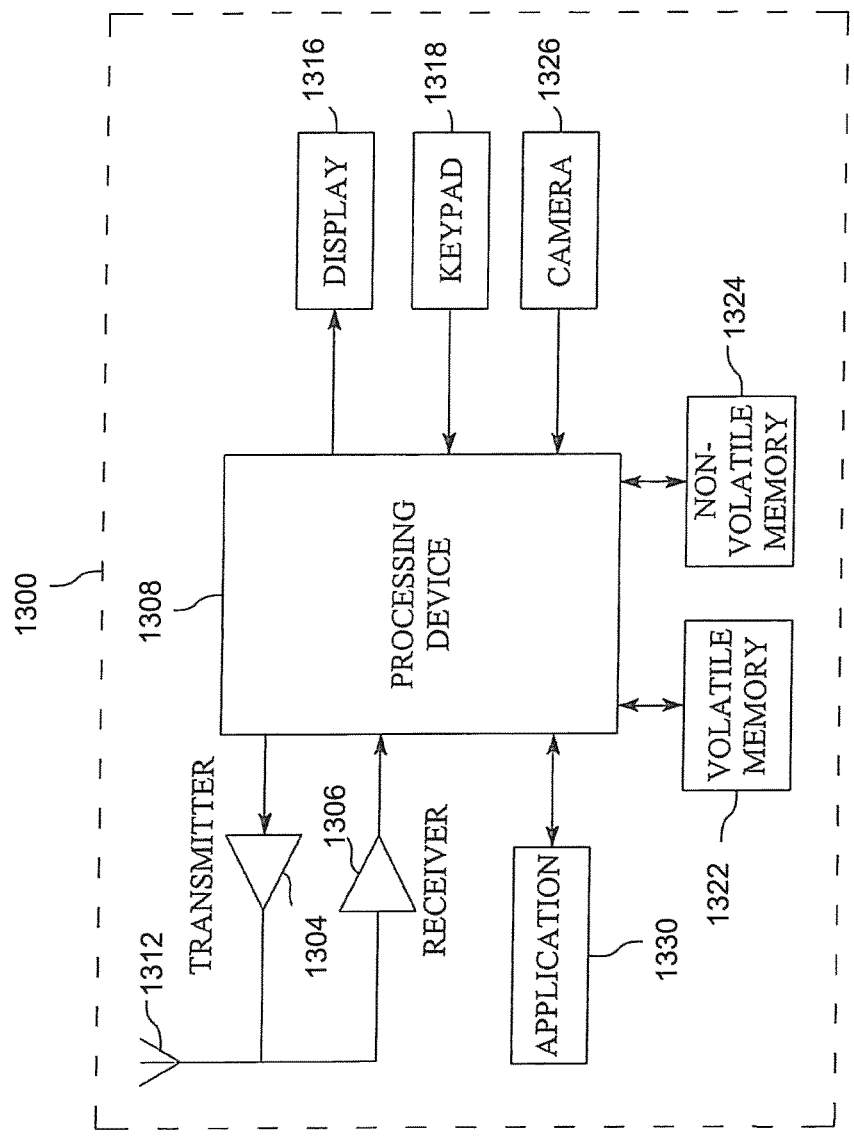
FIG. 5 is a schematic block diagram of an exemplary mobile device according to various embodiments.

FIG. 5 provides an illustrative schematic representative of a mobile device 1300 that can be used in conjunction with various embodiments of the present invention. Mobile devices 1300 can be operated by various parties. As shown in FIG. 5, a mobile device 1300 may include an antenna 1312, a transmitter 1304 (e.g., radio), a receiver 1306 (e.g., radio), and a processing element 1308 that provides signals to and receives signals from the transmitter 1304 and receiver 1306, respectively.

The signals provided to and received from the transmitter 1304 and the receiver 1306, respectively, may include signaling data in accordance with an air interface standard of applicable wireless systems to communicate with various entities, such as the server 1200, the distributed devices 1110, 1120, and/or the like. In this regard, the mobile device 1300 may be capable of operating with one or more air interface standards, communication protocols, modulation types, and access types. More particularly, the mobile device 1300 may operate in accordance with any of a number of wireless communication standards and protocols. In a particular embodiment, the mobile device 1300 may operate in accordance with multiple wireless communication standards and protocols, such as GPRS, UMTS, CDMA2000, 1×RTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol.

Via these communication standards and protocols, the mobile device 1300 may according to various embodiments communicate with various other entities using concepts such as Unstructured Supplementary Service data (USSD), Short Message Service (SMS), Multimedia Messaging Service (MMS), Dual-Tone Multi-Frequency Signaling (DTMF), and/or Subscriber Identity Module Dialer (SIM dialer). The mobile device 300 can also download changes, add-ons, and updates, for instance, to its firmware, software (e.g., including executable instructions, applications, program modules), and operating system.

According to one embodiment, the mobile device 1300 may include a location determining device and/or functionality. For example, the mobile device 1300 may include a GPS module adapted to acquire, for example, latitude, longitude, altitude, geocode, course, and/or speed data. In one embodiment, the GPS module acquires data, sometimes known as ephemeris data, by identifying the number of satellites in view and the relative positions of those satellites.

The mobile device 1300 may also comprise a user interface (that can include a display 1316 coupled to a processing element 1308) and/or a user input interface (coupled to a processing element 1308). The user input interface can comprise any of a number of devices allowing the mobile device 300 to receive data, such as a keypad 1318 (hard or soft), a touch display, voice or motion interfaces, or other input device. In embodiments including a keypad 1318, the keypad can include (or cause display of) the conventional numeric (0-9) and related keys (#, *), and other keys used for operating the mobile device 1300 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The mobile device 1300 can also include volatile storage or memory 1322 and/or non-volatile storage or memory 1324, which can be embedded and/or may be removable. For example, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database mapping systems, data, applications, programs, program modules, scripts, source code, object code, byte code, compiled code, interpreted code, machine code, executable instructions, and/or the like to implement the functions of the mobile device 1300.

The mobile device 1300 may also include one or more of a camera 1326 and a mobile application 1330. The camera 1326 may be configured according to various embodiments as an additional and/or alternative data collection feature, whereby one or more items may be read, stored, and/or transmitted by the mobile device 1300 via the camera. The mobile application 1330 may further provide a feature via which various tasks may be performed with the mobile device 1300. Various configurations may be provided, as may be desirable for one or more users of the mobile device 1300 and the system 1320 as a whole.

It is to be understood that the present invention is not limited to the embodiments described above and illustrated in the drawings; rather, the skilled person will recognize that many changes and modifications may be made within the scope of the appended claims. Such modifications may, for example, involve using a different source of ray gun than the exemplified electron beam such as laser beam. Other materials than metallic powder may be used, such as powder of polymers and powder of ceramics.

The invention claimed is:

1. A device for viewing and/or illuminating a target surface in an evacuated chamber having condensable vapor therein, the device comprising:
   a first section with a through hole having a first end with a first opening and a second end with a second opening;
   a second section having a chamber comprising a first opening, a second opening and a gas inlet, where the second opening of the second section is covered with a first window, wherein the first section is attached to the second section, allowing unobstructed passage between the gas inlet and the first section, wherein the first window is in line of sight with the second opening of the first section and the gas inlet is connectable to a gas reservoir for feeding a gas into the chamber for prohibiting the first window in the chamber from being contaminated of the condensable vapor; and
   a reflective element disposed within the chamber along a central optical path between the first opening and the first window;
   wherein the first opening of the first section is smaller than the second opening of the first section.

2. The device according to claim 1, wherein the first section has a frustoconical shape and comprises an inner wall extending at an angle α with respect to the central optical path, wherein α is less than 50°.

3. The device according to claim 1, wherein the first window is an optical lens.

4. The device according to claim 1, further comprising at least one of:
   a first electromagnetic radiation sensitive sensor for receiving electromagnetic radiation through the first window; and
   a lens system in between the first electromagnetic radiation sensitive sensor and the first window, wherein the first electromagnetic radiation sensitive sensor is an imaging camera, wherein the imaging camera is a CCD-camera, an infrared camera, a near infra-red camera, a C-MOS camera or a heat camera.

5. The device according to claim 1, wherein an area of the first opening of the first section is less than 30 mm$^2$.

6. The device according to claim 1, wherein an area of the second opening of the first section is less than 1000 mm$^2$.

7. The device according to claim 1, wherein a length of the first section is less than 300 mm.

8. The device according to claim 1, wherein a length of the second section is less than 100 mm.

9. The device according to claim 1, wherein the gas is an inert gas and a gas pressure in the chamber is higher than the gas pressure in the first section.

10. The device according to claim 1, further comprising:
the second section comprises a second window; and
the reflective element disposed in the chamber, the reflective element reflecting portions of electromagnetic radiation emanating from the target surface through the first and second windows.

11. The device according to claim 10, further comprising a first electromagnetic radiation sensor disposed in front of the first window and a second electromagnetic radiation sensor disposed in front of the second window, wherein a first electromagnetic radiation sensitive sensor has a first spectral sensitivity band which is different to a second spectral sensitivity band of a second electromagnetic radiation sensitive sensor.

12. The device according to claim 11, wherein the first and second band are partially overlapping each other.

13. The device according to claim 1, further comprising a second reflective element arranged outside the chamber and arranged so as to reflect at least a portion of an electromagnetic radiation emanating from the target surface in the evacuated chamber passing through the first window onto an electromagnetic radiation sensitive sensor.

14. The device according to claim 1, further comprising an electromagnetic radiation source for illuminating the target surface through the first window.

15. The device according to claim 14, wherein a wavelength of at least one of the electromagnetic radiation source is adapted to a sensitivity of an electromagnetic radiation sensitive sensor for receiving reflected radiation from the target surface.

16. A device for viewing and/or illuminating a target surface in an evacuated chamber having condensable vapor therein, the device comprising:
a chamber comprising a first portion with a first opening, a second portion with a second opening and a gas inlet, where the second opening is covered with a first window, the first portion is attached to the second portion allowing unobstructed passage between the gas inlet and a first section, the first window is in line of sight with the first opening of the chamber and the gas inlet is connectable to a gas reservoir for feeding a gas into the chamber for prohibiting the first window in the chamber for being contaminated of the condensable vapor; and
a reflective element disposed within the chamber along a central optical path between the first opening and the first window;
wherein the first portion comprises an inner wall extending at an angle α with respect to the optical path, wherein α is less than 50°.

17. A method for forming three-dimensional articles by successive fusing together of selected areas of a powder bed in an evacuated chamber of an additive manufacturing apparatus, which areas correspond to successive cross sections of a three-dimensional article, the method comprising,
a. applying a powder layer to a work table in the evacuated chamber,
b. fusing the powder layer by supplying energy from a high energy radiation source according to an operating scheme determined for the powder layer to the selected area within the powder layer such that the powder layer in the selected area is fused into cross sections of said three-dimensional article,
c. providing a second chamber, the second chamber is provided with a gas inlet for providing a gas into the second chamber, and a first opening covered with a first window, the second chamber and the evacuated chamber having at least one common opening, where the second chamber and the evacuated chamber are attached to allow unobstructed passage between the gas inlet and the evacuated chamber,
d. viewing and/or illuminating a target surface in the evacuated chamber via, a reflective element disposed within the evacuated chamber along a central optical path between the common opening and the first window, and
e. providing gas into the evacuated chamber through the common opening.

18. The method according to claim 17, wherein a first pressure in the second chamber is higher than a second pressure in the evacuated chamber.

* * * * *